United States Patent
Yasuda et al.

(10) Patent No.: US 7,148,521 B2
(45) Date of Patent: Dec. 12, 2006

(54) SEMICONDUCTOR LIGHT EMITTING DEVICE AND METHOD OF MANUFACTURING THE SAME

(75) Inventors: Hidefumi Yasuda, Kanagawa-ken (JP); Yuko Kato, Kanagawa-ken (JP); Kazuyoshi Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/047,666

(22) Filed: Feb. 2, 2005

(65) Prior Publication Data

US 2005/0189556 A1    Sep. 1, 2005

(30) Foreign Application Priority Data

Feb. 13, 2004    (JP)    ............................. 2004-036334

(51) Int. Cl.
*H01L 29/22*    (2006.01)
(52) U.S. Cl. ........................... 257/98; 257/99; 257/778
(58) Field of Classification Search .................. 257/98, 257/99, 778; 438/26, 29, 39
See application file for complete search history.

(56) References Cited

U.S. PATENT DOCUMENTS

| 6,522,676 B1 | 2/2003 | Takenori et al. | |
| 6,784,460 B1 * | 8/2004 | Ng et al. | 257/95 |
| 6,825,502 B1 * | 11/2004 | Okazaki et al. | 257/98 |
| 6,878,969 B1 * | 4/2005 | Tanaka et al. | 257/79 |
| 7,009,199 B1 * | 3/2006 | Hall | 257/14 |
| 2003/0015721 A1 * | 1/2003 | Slater et al. | 257/99 |
| 2005/0189556 A1 | 9/2005 | Yasuda et al. | |

FOREIGN PATENT DOCUMENTS

| JP | 6-318731 | 11/1994 |
| JP | 11-340514 | 12/1999 |
| JP | 2003-163373 | 6/2003 |
| JP | 2003-197963 | 7/2003 |

OTHER PUBLICATIONS

U.S. Appl. No. 11/208,638, filed Aug. 23, 2005, Furukawa et al.
U.S. Appl. No. 11/208,654, Filed Aug. 23, 2005, Miyagaki et al.
U.S. Appl. No. 11/342,539, Filed Jan. 31, 2006, Kato et al.

* cited by examiner

*Primary Examiner*—Sara Crane
(74) *Attorney, Agent, or Firm*—Oblon, Spivak, McClelland, Maier & Neustadt, P.C.

(57) ABSTRACT

A semiconductor light emitting device comprises: a substrate having first and second major surfaces; a light emitting layer provided in a first portion on the first major surface of the substrate; a first electrode provided above the light emitting layer; a second electrode provided in a second portion on the first major surface of the substrate, the second portion being different from the first portion; and a protrusion provided on the second major surface of the substrate, the protrusion having a planar shape that reflects a planar shape of a light emitting area of the light emitting layer, the light emitting area being sandwiched between the first electrode and the second electrode and facing the protrusion.

20 Claims, 24 Drawing Sheets

SEMICONDUCTOR LIGHT EMITTING DEVICE AND METHOD OF MANUFACTURING THE SAME

CROSS-REFERENCE TO RELATED APPLICATIONS

This application is based upon and claims the benefit of priority from the prior Japanese Patent Application No. 2004-036334, filed on Feb. 13, 2004; the entire contents of which are incorporated herein by reference.

BACKGROUND OF THE INVENTION

The invention relates to a semiconductor light emitting device and a method of manufacturing the same, and more particularly, to a semiconductor light emitting device such as a flip-chip type semiconductor laser and light emitting diode (LED), and a method of manufacturing the semiconductor light emitting device.

When a flip-chip type semiconductor light emitting device is mounted on a substrate or submount member, chip fixing and electrical wiring can be achieved at the same time (e.g., Japanese Laid-Open Patent Application 2003-163373). Since no bonding wire is needed, many advantages are obtained. For example, the manufacturing process is simplified, parasite capacitance and inductance are reduced, and the packaging size can be made compact.

However, the inventors' independent trial production and investigation has revealed that the light extraction efficiency of flip-chip type semiconductor light emitting devices has room for improvement.

SUMMARY OF THE INVENTION

According to an aspect of the invention, there is provided a semiconductor light emitting device comprising:

a substrate having a first major surface and a second major surface;

a light emitting layer provided in a first portion on the first major surface of the substrate;

a first electrode provided above the light emitting layer;

a second electrode provided in a second portion on the first major surface of the substrate, the second portion being different from the first portion; and a protrusion provided on the second major surface of the substrate, the protrusion having a planar shape that reflects a planar shape of a light emitting area of the light emitting layer, the light emitting area being sandwiched between the first electrode and the second electrode.

According to other aspect of the invention, there is provided a semiconductor light emitting device comprising:

a substrate having a first major surface and a second major surface, the first major surface having a first portion and a second portion;

a light emitting layer provided in the first portion on the first major surface;

a first electrode provided above the light emitting layer;

a second electrode provided in the second portion on the first major surface; and a protrusion provided on the second major surface of the substrate, the protrusion corresponding to an edge of the light emitting layer, the edge being sandwiched between the first electrode and the second electrode.

According to other aspect of the invention, there is provided a method of manufacturing a semiconductor light emitting device comprising:

forming a semiconductor multilayered structure on a first major surface of a substrate having the first major surface and a second major surface, the semiconductor multilayered structure including a light emitting layer;

forming a metal layer selectively on the semiconductor multilayered structure;

removing a part of the semiconductor multilayered structure by using the metal layer as a mask;

forming a second electrode on a region where the part of the semiconductor multilayered structure is removed;

forming a first electrode on the metal layer, the first electrode being apart from an edge of the metal layer, the edge being closer to the second electrode;

alloying a part of the metal layer, the first electrode and an underlying semiconductor layer, the part of the metal layer being under the first electrode; and forming a protrusion by processing the second major surface of the substrate, the protrusion corresponding to a edge of the light emitting layer, the edge being sandwiched between the first electrode and the second electrode.

DETAILED DESCRIPTION

Embodiments of the invention will now be described with reference to the drawings.

Figure 1A:
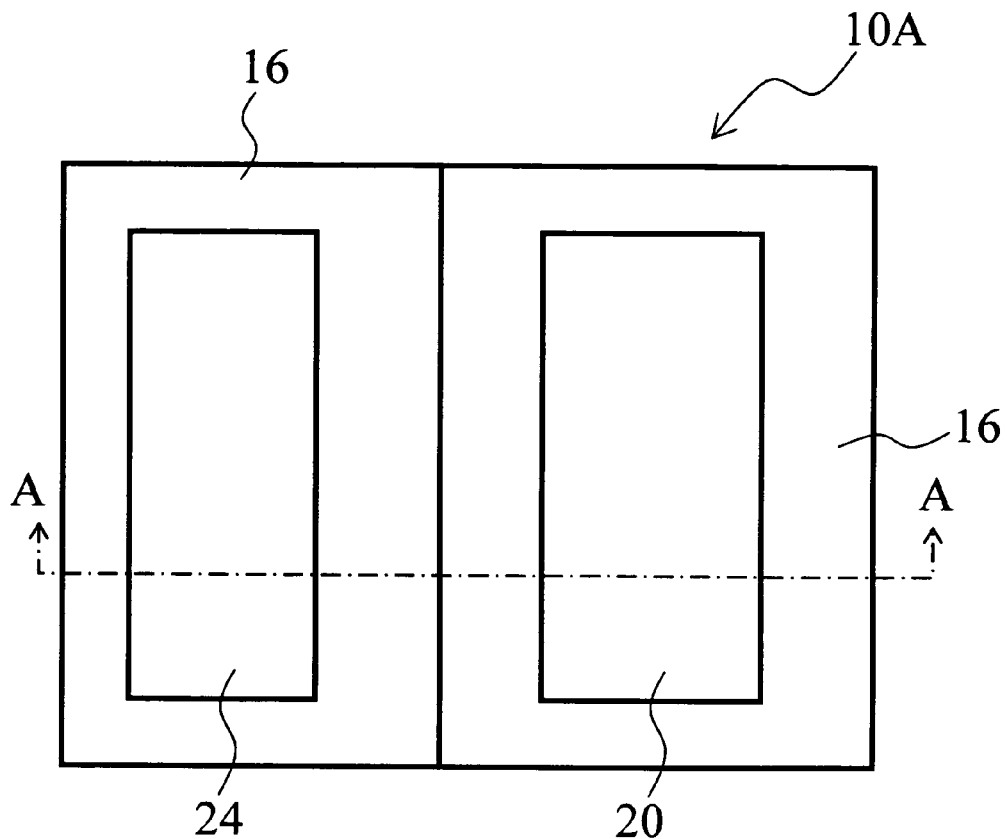
FIG. 1A is a plan view of a semiconductor light emitting device of this embodiment as viewed from its electrode.
Figure 1B:
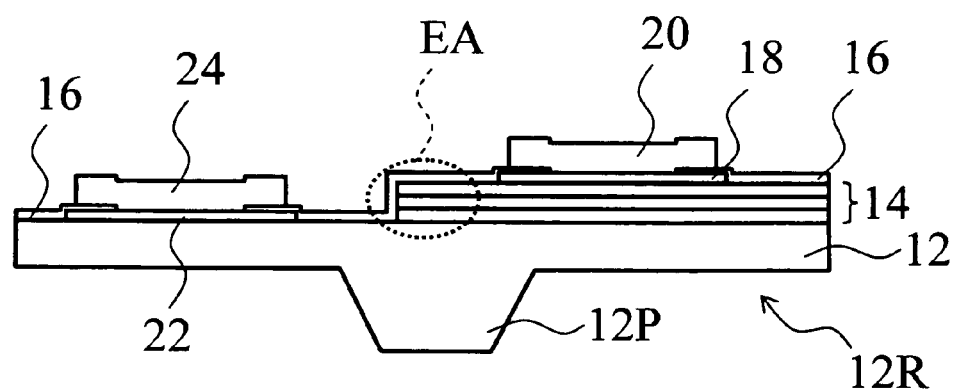
FIG. 1B is a line A—A cross-sectional view thereof.
Figure 2A:
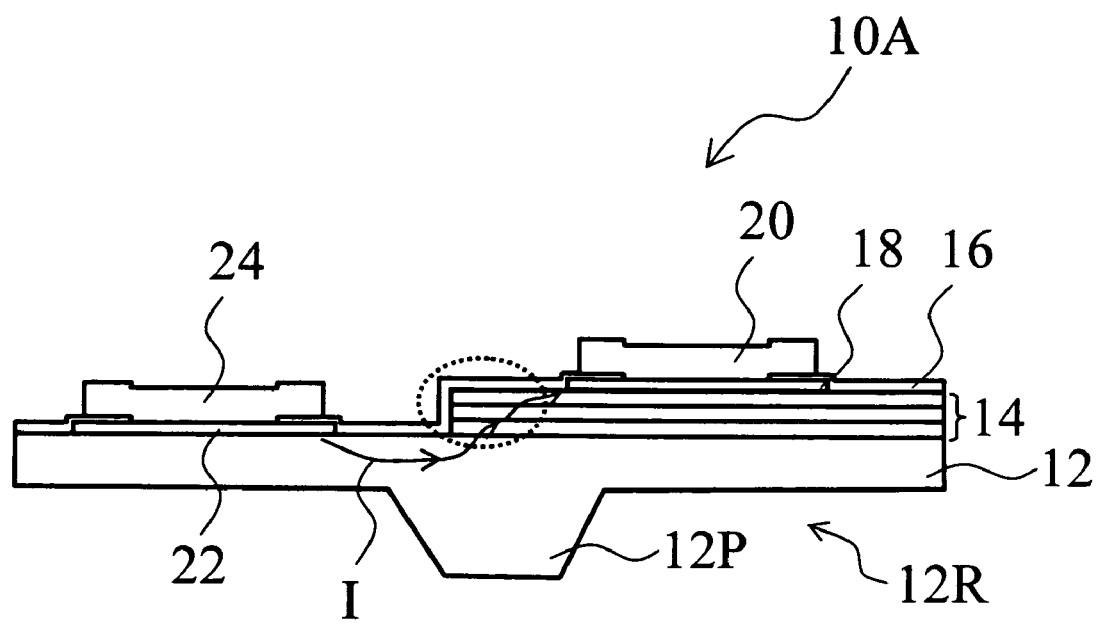
FIG. 2A is a line A—A cross-sectional view of FIG. 1A.
Figure 2B:
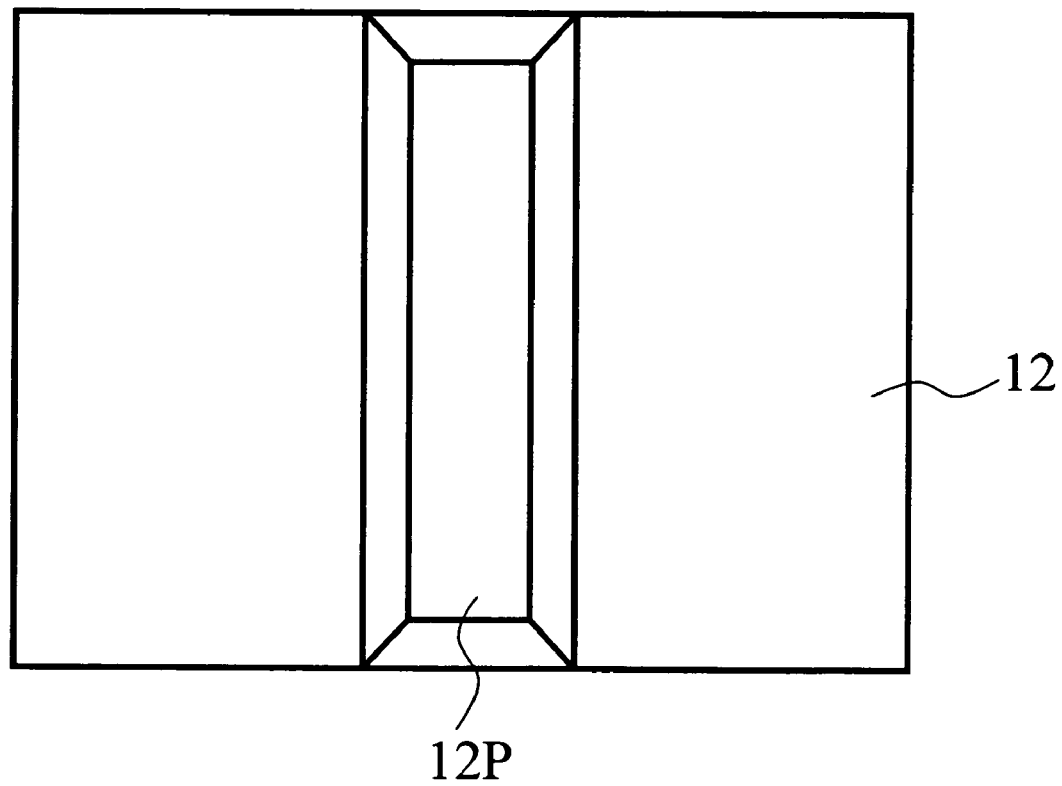
FIG. 2B is a plan view of this semiconductor light emitting device as viewed from its light extraction surface.

FIGS. 1 and 2 are schematic views showing a semiconductor light emitting device according to an embodiment of the invention. More specifically, FIG. 1A is a plan view of a semiconductor light emitting device of this embodiment as viewed from its electrode, and FIGS. 1B and 2A are line A—A cross-sectional views thereof. FIG. 2B is a plan view of this semiconductor light emitting device as viewed from its light extraction surface.

The semiconductor light emitting device 10A has a structure comprising a GaP substrate 12 selectively covered with a stacked body including a light emitting layer 14, on which an n-side electrode 18 is provided. A solder electrode 20 is provided on the n-side electrode 18. A p-side electrode 22 is provided on the GaP substrate 12. Another solder electrode 24 is provided on the p-side electrode 22. The surface of the GaP substrate 12 and the light emitting layer 14 other than the portions having contact with the electrodes 18 and 22 is provided with protective insulation by an insulating film 16. The solder electrodes 20 and 24 may be formed from AuSn (gold-tin) having eutectic composition, for example. It should be noted that the figures are schematic, and the relations of thickness and size of various elements are different from those of actual devices.

The light emitting layer 14 can include as appropriate a plurality of layers such as a cladding layer, optical guide layer, current diffusion layer, and contact layer, in addition to the active layer. FIGS. 1 and 2 illustrate the light emitting layer 14 having a stacked layer structure composed of three layers. However, the invention is not limited thereto. The number of layers can be varied as appropriate.

The solder electrodes 20 and 24 of the flip-chip type light emitting device of this embodiment are bonded to a packaging substrate or the like (not shown) for chip fixing and electrical connection. Light emission occurs by injection of current to the light emitting layer 14 via the electrodes 18 and 22. At this time, current I injected from the p-side electrode 22 does not spread across the light emitting layer 14, but passes through a nearly shortest path as indicated by arrow I in FIG. 2A and flows out of the light emitting layer 14 to the n-side electrode 18. That is, light emission concentrates in a light emitting area EA near the edge of the light emitting layer 14 between the electrodes 18 and 22. In the following, this point will be specifically described.

Figure 24A:
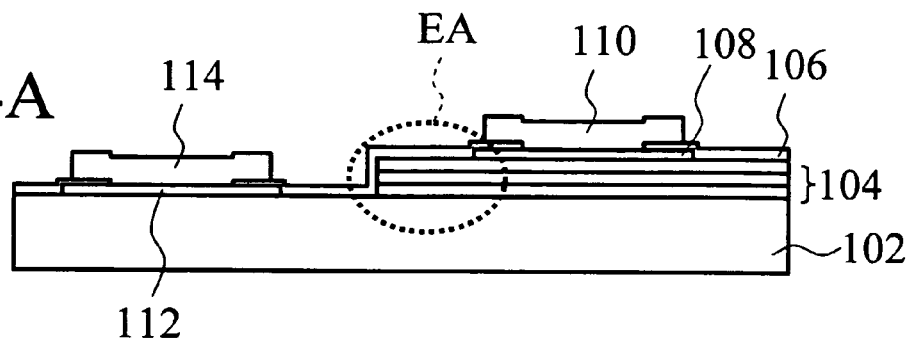
FIG. 24A is a schematic cross-sectional view of a flip-chip type semiconductor light emitting device investigated in the process leading to the invention by the inventors.
Figure 24B:
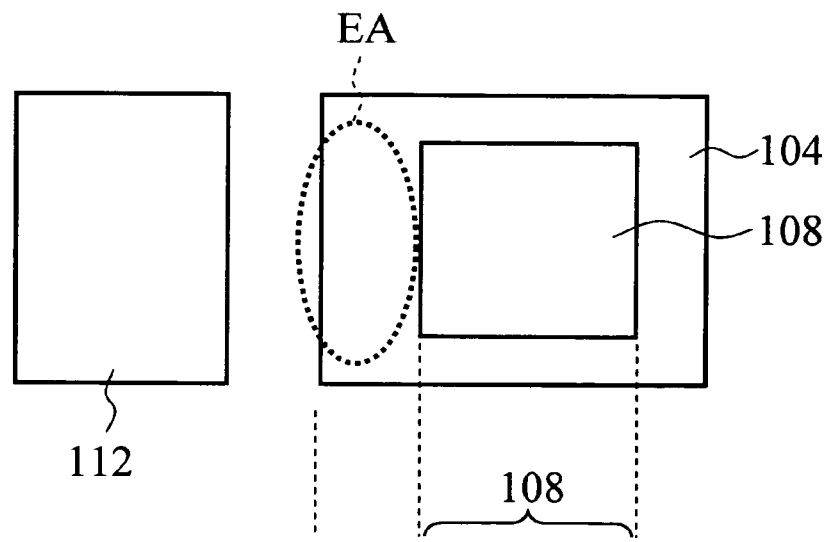
FIG. 24B is a schematic view showing the planar arrangement relationship of part of the elements thereof.
Figure 24C:
FIG. 24C is a photograph showing the distribution of light emission intensity in the light emitting layer.

FIG. 24 is a schematic view of a flip-chip type semiconductor light emitting device investigated in the process leading to the invention by the inventors. More specifically, FIG. 24A is a schematic cross-sectional view of the semiconductor light emitting device, FIG. 24B is a schematic view showing the planar arrangement relationship of part of the elements thereof, and FIG. 24C is a photograph showing the distribution of light emission intensity in the light emitting layer.

This semiconductor light emitting device has a structure comprising a GaP substrate 102 selectively covered with a stacked body including a light emitting layer 104, on which an n-side electrode 108 is provided, on which, in turn, a solder electrode 110 is provided. A p-side electrode 112 is provided on the GaP substrate 102. Another solder electrode 114 is provided on the p-side electrode 112. The surface of the GaP substrate 102 and the light emitting layer 104 other than the portions having contact with the electrodes 108 and 112 is provided with protective insulation by an insulating film 106.

The solder electrodes 110 and 114 of this flip-chip type light emitting device are bonded to a packaging substrate or the like (not shown) for chip fixing and electrical connection. Light emission occurs by injection of current to the light emitting layer 104 via the electrodes 108 and 112. This light emission is externally extracted via the substrate 102.

However, the inventors' investigation has revealed that in such a semiconductor light emitting device, light emission does not occur throughout the light emitting layer 104, but occurs only in a portion thereof. More specifically, light emission occurs in a light emitting area EA between the n-side electrode 108 and the p-side electrode 112. As seen from FIG. 24C, light emission occurs between the n-side electrode 108 and the p-side electrode 112. In particular, it is observed that light emission tends to increase at the edge of the light emitting layer 104. It is considered that this is a phenomenon due to concentration of current flowing between these electrodes.

However, when light emission locally occurs like this, light extraction efficiency decreases.

Figure 25:
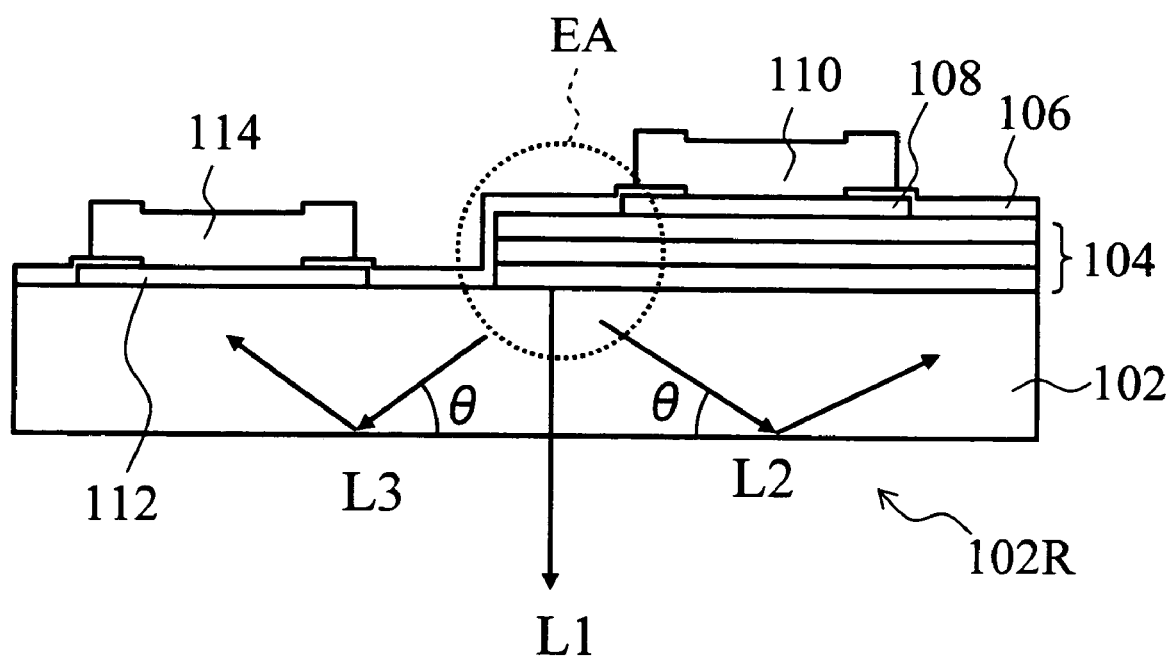
FIG. 25 is a schematic cross-sectional view illustrating the traveling path of light emitted from the light emitting layer.

FIG. 25 is a schematic cross-sectional view illustrating the traveling path of light emitted from the light emitting layer.

Of all the light emitted from the light emitting area EA, the light L1 incident on the rear surface 102R (serving as a light extraction surface) of the GaP substrate 102 in a substantially perpendicular direction can be externally extracted without reflection. However, the light L2, L3 incident on the rear surface 102R in an oblique direction is totally reflected for small incident angle θ and is difficult to extract externally. For example, when the periphery of the GaP substrate (refractive index 3.23) is sealed with packaging resin (refractive index 1.5), total reflection occurs if the incident angle θ relative to the rear surface 102R of the GaP substrate is about 27 degrees or less. Since most of the totally reflected light like this is attenuated inside the light emitting device through scattering and absorption, it is difficult to extract externally. Thus the amount of light emitted from the light emitting device is smaller than the amount of light expected from the amount of current passed through the device.

In contrast, in the present embodiment, a protrusion 12P is provided on the light extraction surface 12R of the substrate 12. The protrusion 12P is provided in agreement with the edge of the light emitting layer 14 where current concentrates, that is, with the light emitting area EA. With such a protrusion 12P, light emission that occurs locally in the light emitting layer 14 can be externally extracted with high efficiency.

Figure 3:
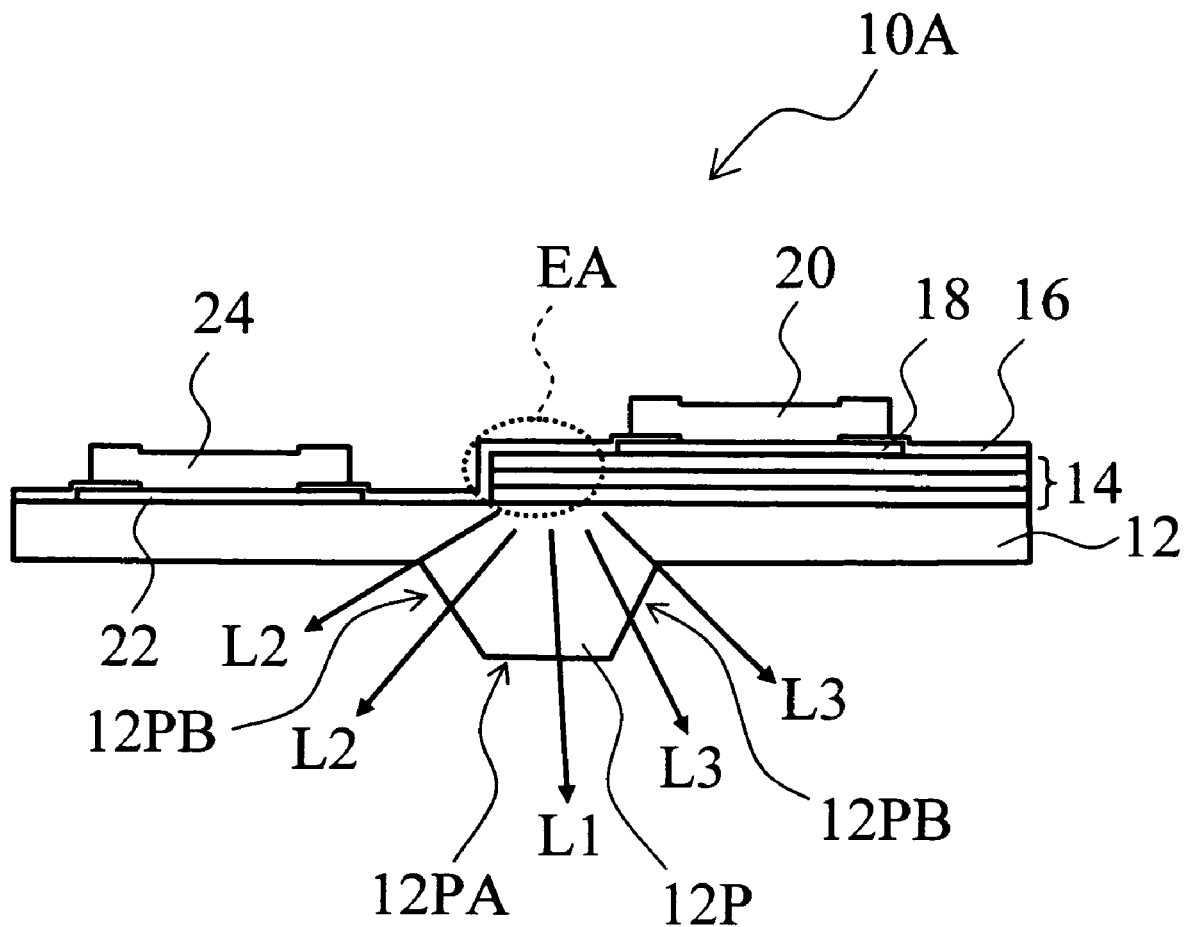
FIG. 3 is a schematic view for illustrating the function of the protrusion 12P.

FIG. 3 is a schematic view for illustrating the function of the protrusion 12P.

More specifically, the light L1 emitted from the light emitting area EA in a substantially perpendicular downward direction in this figure is incident on the tip surface 12PA of the protrusion 12P and externally extracted. On the other hand, many components of the light L2, L3 emitted from the light emitting area EA in oblique downward directions are incident on the side surface 12PB of the protrusion 12P. At this time, since the incident angle relative to the side surface 12PB is greater, total reflection is decreased, which causes more light to be emitted externally from the side surface 12PB. That is, with the protrusion 12P, light having a wider range of angles of all the light emitted from the light emitting area EA can be externally extracted without total reflection. As a result, the external quantum efficiency can be improved, and the brightness of the semiconductor light emitting device can be increased.

The size and height of the protrusion 12P, and the oblique angle of its side surface can be optimized as appropriate depending on the structural parameters of the semiconductor light emitting device. In the following, some specific examples of the semiconductor light emitting device of the invention will be described with reference to the drawings. With respect to the figures mentioned below, elements similar to those already described are marked with the same numerals and are not described in detail.

Figure 4:
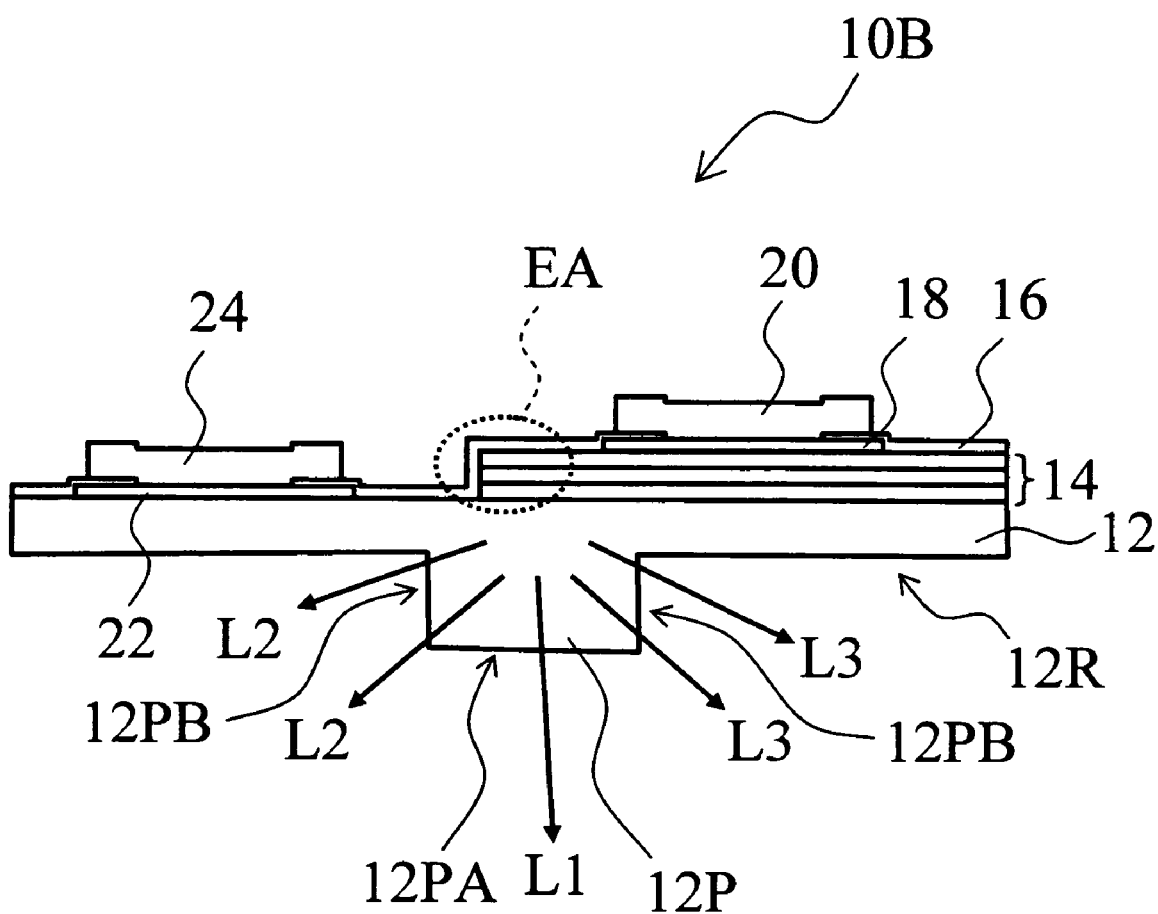
FIG. 4 is a schematic cross-sectional view showing a second specific example of a semiconductor light emitting device of this embodiment.

FIG. 4 is a schematic cross-sectional view showing a second specific example of a semiconductor light emitting device of this embodiment.

More specifically, the semiconductor light emitting device 10B of this specific example is provided with a protrusion 12P having side surfaces 12PB that are formed substantially perpendicular to the light extraction surface 12R of the substrate 12. Even when the side surface is formed substantially perpendicular like this, the external extraction efficiency of light emitted from the light emitting area EA can be increased. The protrusion 12P having perpendicular side surfaces can be formed by anisotropic etching such as RIE (reactive ion etching) or ion milling, besides the so-called wet etching.

The cross-sectional shape of the protrusion 12P that can be provided in the semiconductor light emitting device of this embodiment is not limited to those illustrated in FIGS. 1 to 4. In addition to them, for example, a protrusion having a curved tip surface 12PA, or a protrusion having a cross section of substantially triangular shape may be used.

Figure 5A:
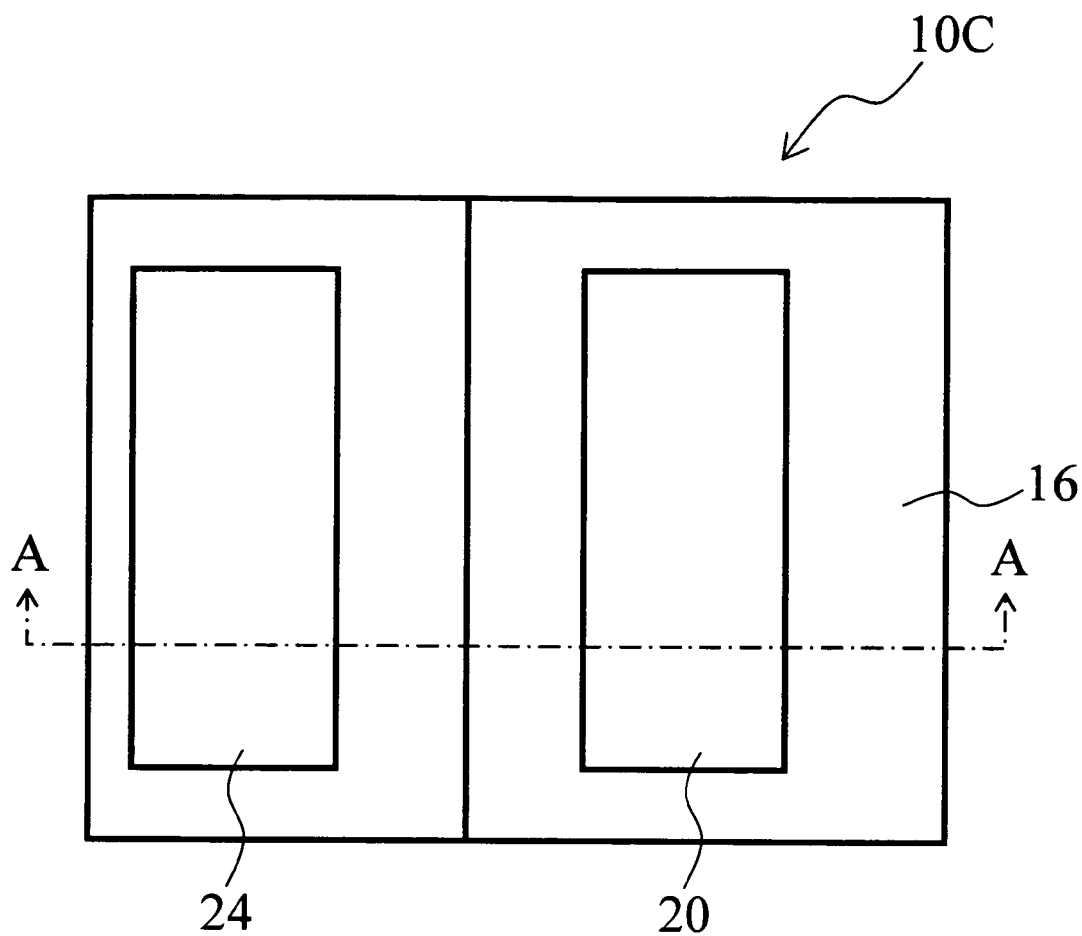
FIG. 5A is a plan view of a third specific example of a semiconductor light emitting device of this embodiment as viewed from its electrode.
Figure 5B:
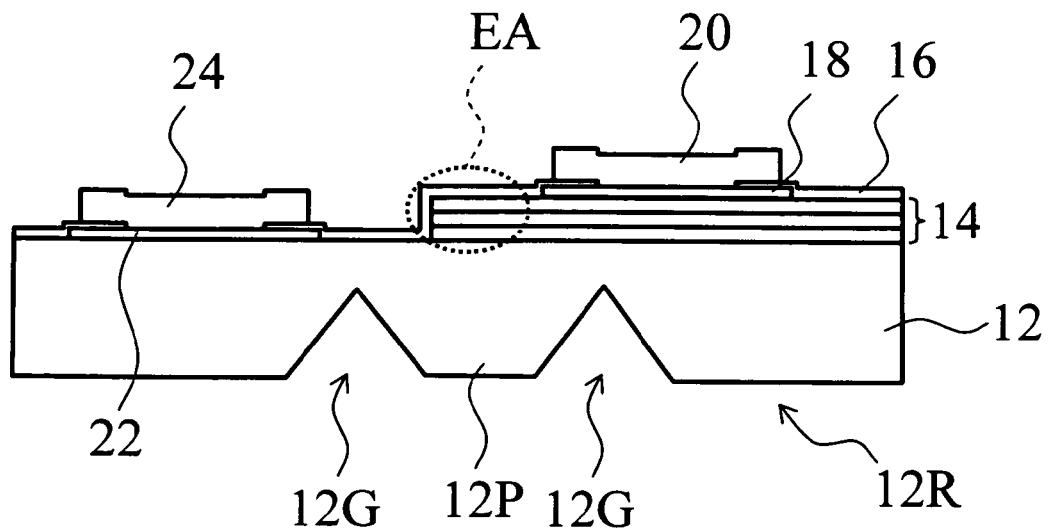
FIG. 5B is a line A—A cross-sectional view thereof.
Figure 6:
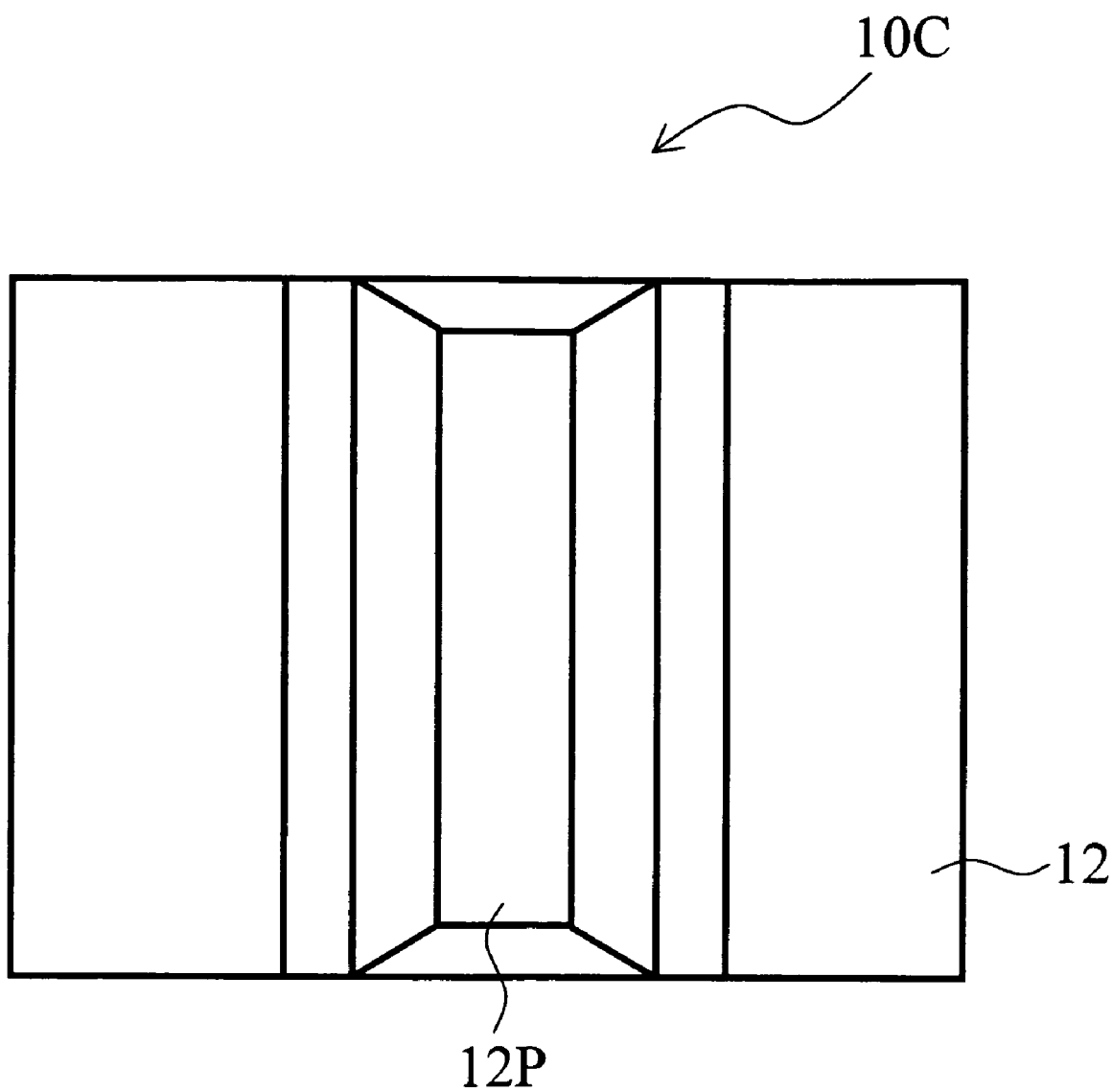
FIG. 6 is a plan view of this semiconductor light emitting device as viewed from its light extraction surface.
Figure 7:
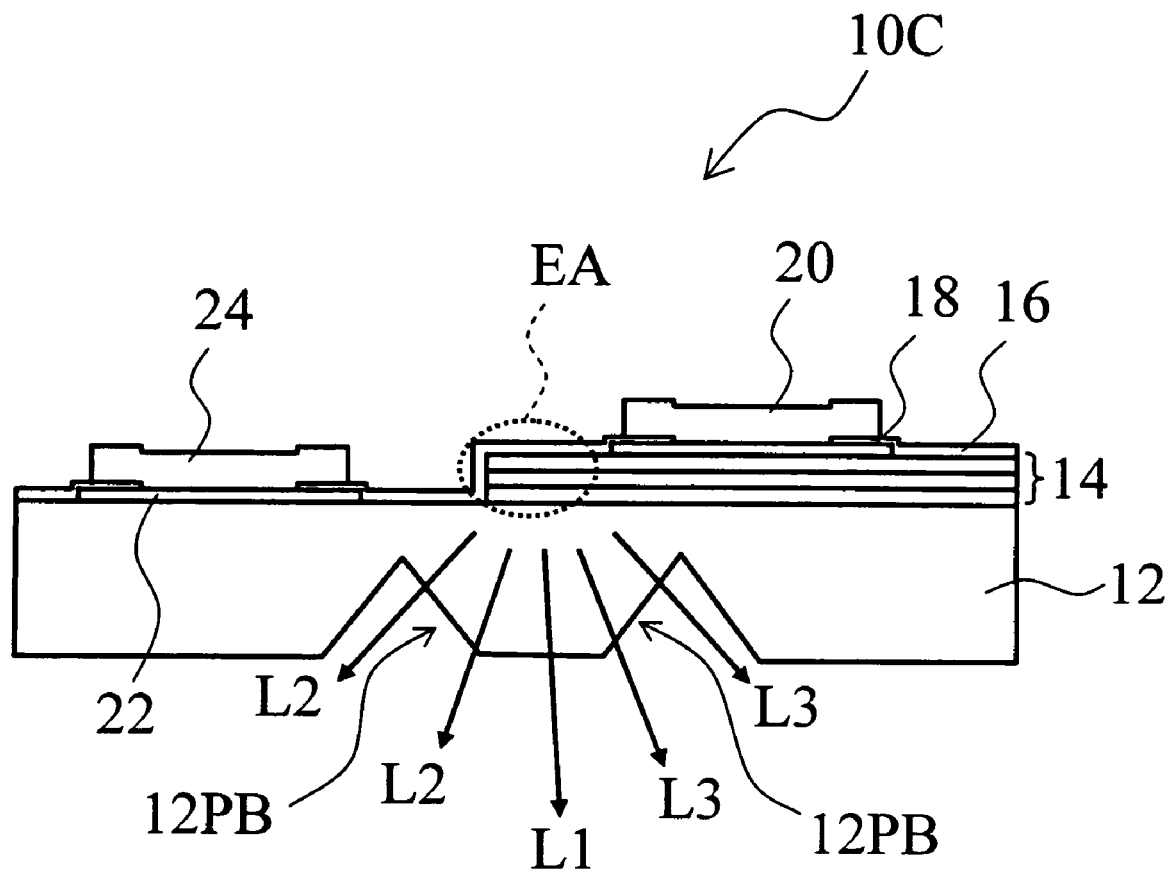
FIG. 7 is a line A—A cross-sectional view of FIG. 5A.

FIGS. 5 to 7 are schematic views showing a third specific example of a semiconductor light emitting device of this embodiment. More specifically, FIG. 5A is a plan view of the semiconductor light emitting device of this specific example as viewed from its electrode, and FIGS. 5B, and 7 are line A—A cross-sectional views thereof. FIG. 6 is a plan view of this semiconductor light emitting device as viewed from its light extraction surface.

In this semiconductor light emitting device 10C, a protrusion 12P is formed by providing grooves 12G on the rear surface 12R of the substrate 12. Also in this case, many components of the light L2, L3 emitted from the light emitting area EA in oblique downward directions tend to be emitted externally from the side surfaces 12PB of the protrusion 12P without total reflection.

In this specific example, the grooves 12G can be provided on the substrate 12 by, for example, making a cut with a dicing blade, besides wet etching and dry etching. Thus the protrusion 12P can be formed quickly and easily.

In addition, the thickness of the substrate 12 can be increased in the portion around the protrusion 12P. Thus the mechanical strength of the semiconductor light emitting device is improved. As a result, for example, the problems of cracking of the semiconductor light emitting device and introduction of mechanical distortion at the time of flip-chip mounting can be suppressed.

It should be noted that the cross section of the groove 12G in this specific example is not required to be of symmetric shape.

Figure 8:
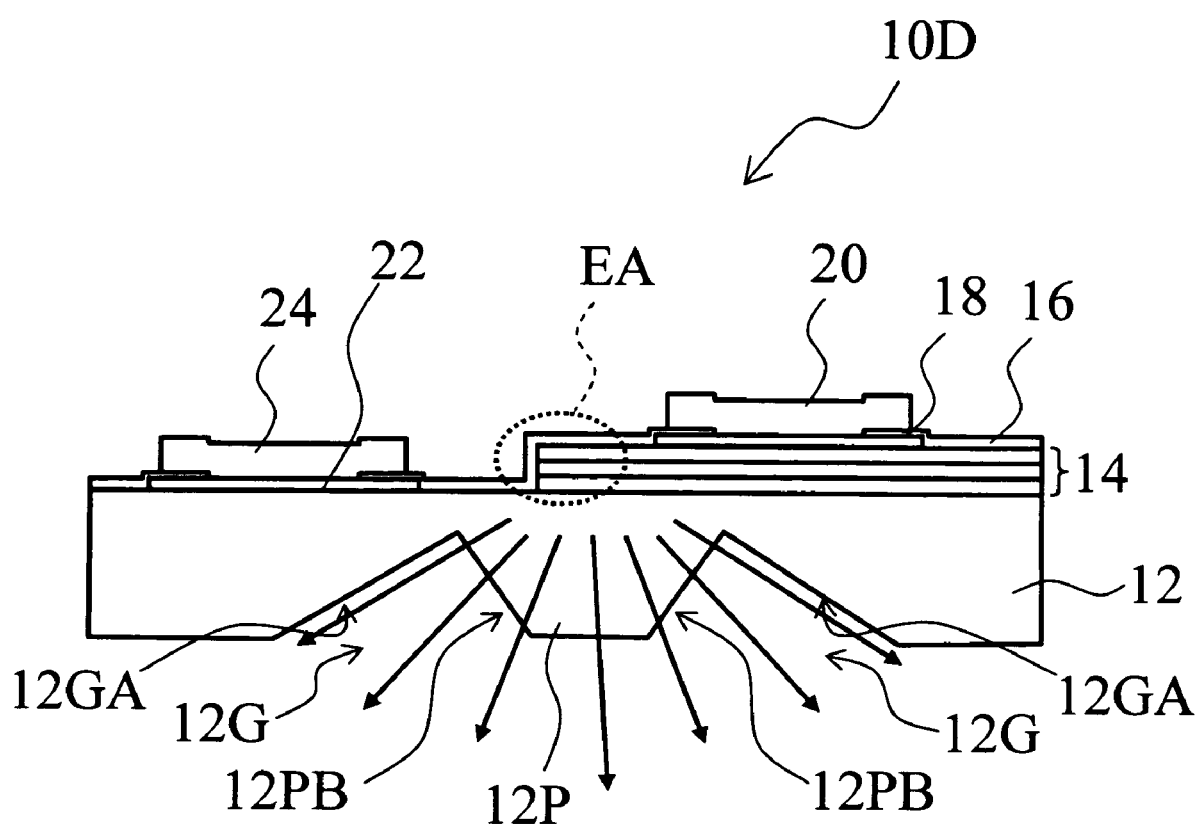
FIG. 8 is a schematic cross-sectional view showing a specific example in which asymmetric grooves 12G are provided.

FIG. 8 is a schematic cross-sectional view showing a specific example in which asymmetric grooves 12G are provided.

More specifically, in the semiconductor light emitting device 10D of this specific example, the side surface 12GA of the groove 12G has a greater slope than the opposed side surface 12PB of the protrusion 12P. This can suppress the problem that light emitted from the side surface 12PB of the protrusion 12P is "kicked" by the opposed side surface 12GA of the groove 12G. That is, this can prevent the groove 12GA from blocking the emission path of light. As a result, the brightness of the semiconductor light emitting device can be further increased.

Figure 9:
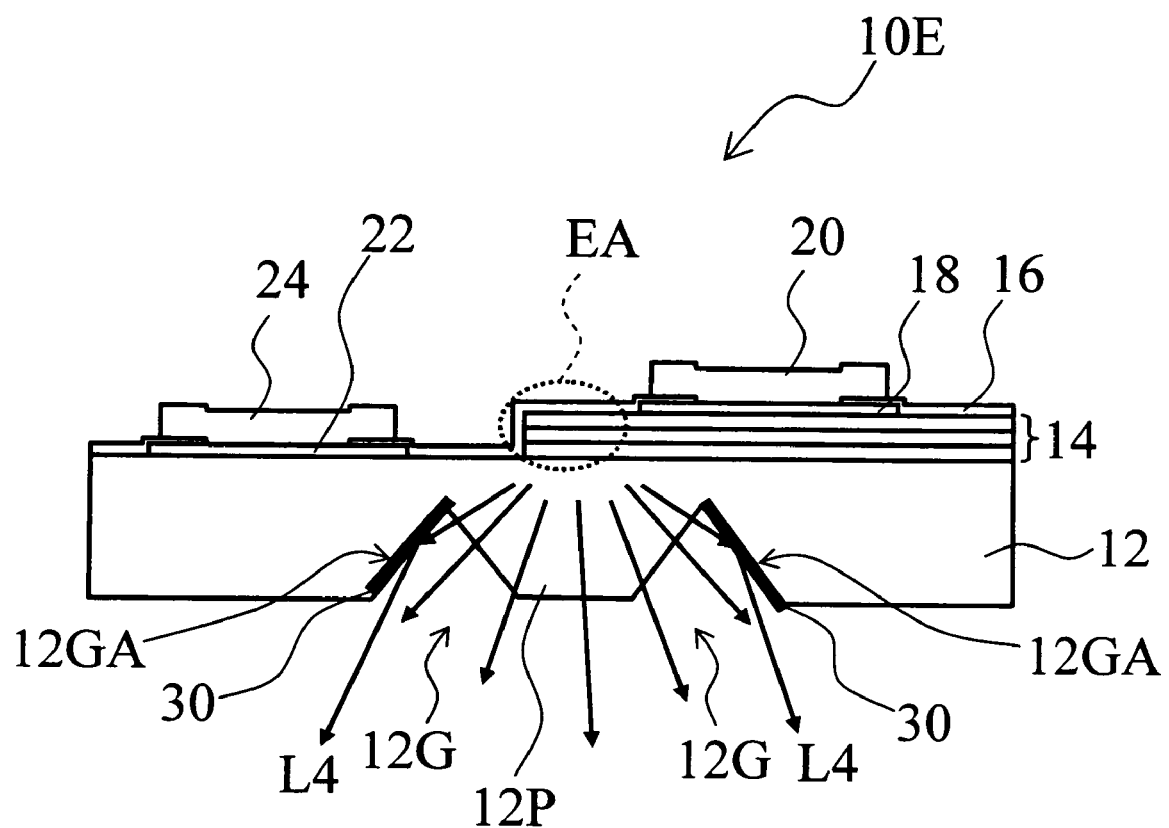
FIG. 9 is a schematic cross-sectional view showing a fifth specific example of a semiconductor light emitting device of this embodiment.

FIG. 9 is a schematic cross-sectional view showing a fifth specific example of a semiconductor light emitting device of this embodiment.

Also in this semiconductor light emitting device 10E, a protrusion 12P is formed by providing grooves 12G. In addition, the side surface 12GA of the groove 12G facing the protrusion 12P is covered with a light reflecting layer 30. The light reflecting layer 30 reflects light (e.g., light L4) emitted at a wide angle from the side surface 12PB of the protrusion 12P in a more perpendicular direction. As a result, light extraction efficiency can be increased and light convergence can also be increased.

The light reflecting layer 30 in this specific example may be, for example, a reflector made of metal such as gold (Au) or aluminum (Al), or a Bragg reflector (distributed Bragg reflector) made of multilayer film of dielectric or semiconductor.

Figure 10:
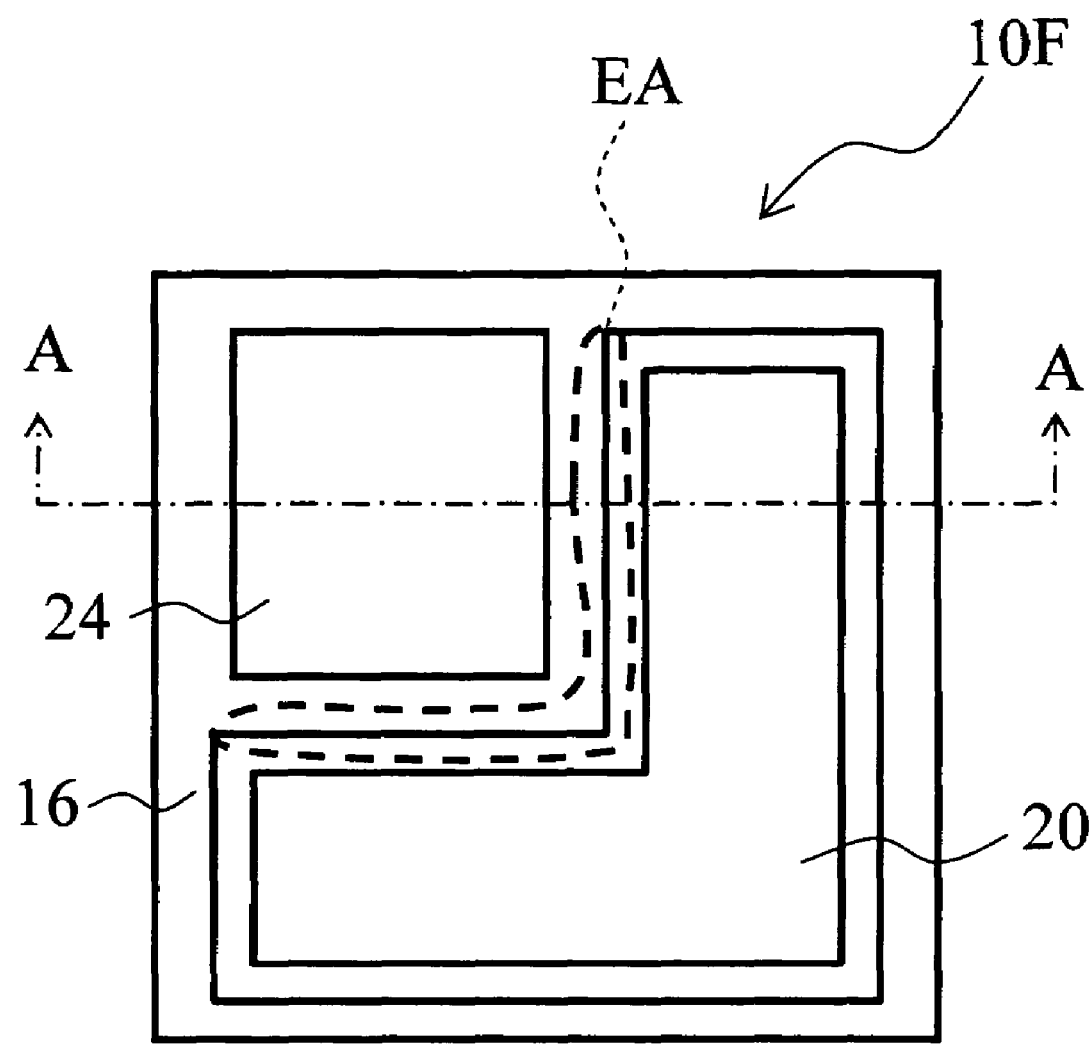
FIG. 10 is a plan view of a sixth specific example of a semiconductor light emitting device of this embodiment as viewed from its electrode.
Figure 11:
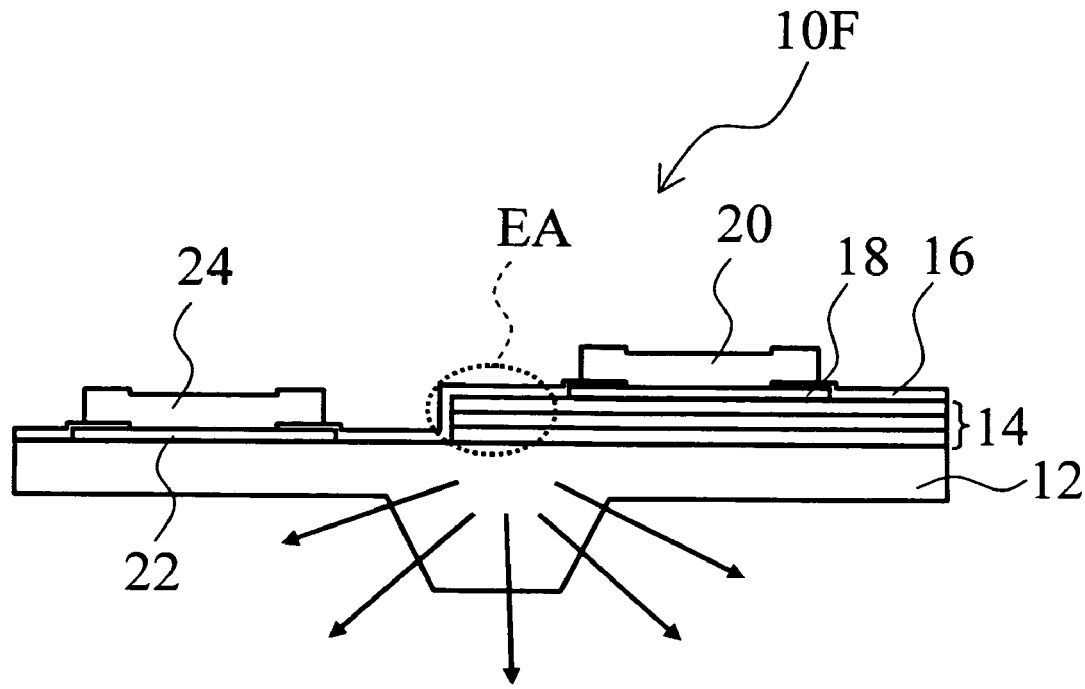
FIG. 11 is a line A—A cross-sectional view of FIG. 10.
Figure 12:
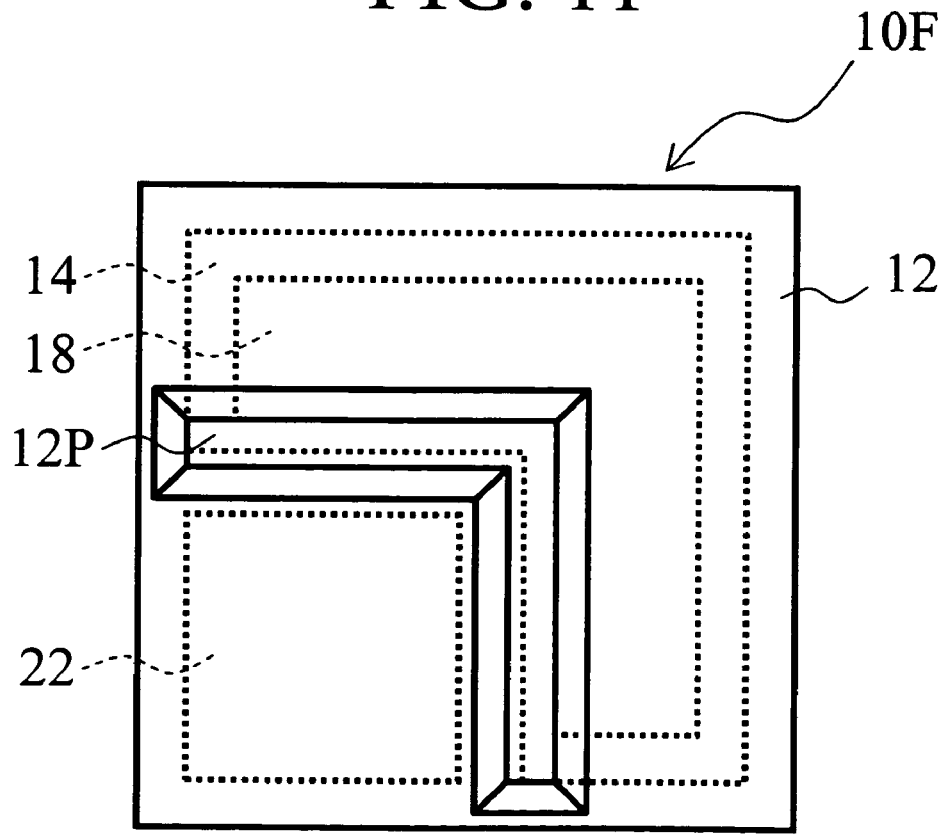
FIG. 12 is a plan view of the semiconductor light emitting device of the sixth specific example as viewed from its light extraction surface.

FIGS. 10 to 12 are schematic cross-sectional views showing a sixth specific example of a semiconductor light emitting device of this embodiment. More specifically, FIG. 10 is a plan view of a semiconductor light emitting device of this specific example as viewed from its electrode, and FIG. 12 is a plan view of this semiconductor light emitting device as viewed from its light extraction surface. FIG. 11 is a line A—A cross-sectional view of FIG. 10.

This semiconductor light emitting device 10F is provided with a light emitting layer 14 patterned in a substantially L-shaped configuration on the substrate 12 having a substantially square shape. An n-side electrode 18 and a solder electrode 20 are provided on the light emitting layer 14. A p-side electrode 22 and a solder electrode 24 are provided on the substrate 12. In this semiconductor light emitting device, in the light emitting layer 14 formed in a substantially L-shaped configuration, current concentrates near the edge located between the p-side electrode 22 and the n-side electrode 18 to form a light emitting area EA having a substantially L-shaped configuration.

In this specific example, in agreement with this light emitting area EA, a protrusion 12P having a substantially L-shaped configuration is provided on the light extraction surface 12R of the substrate 12. That is, the protrusion 12P is formed in agreement with the shape of the edge of the light emitting layer 14 located between the p-side electrode 22 and the n-side electrode 18. With the protrusion 12P like this, light emission that occurs in the light emitting layer 14 can be extracted from the light extraction surface 12R of the substrate 12 with high efficiency.

It should be noted that also in this specific example, the protrusion 12P may be formed by forming grooves 12G in the light extraction surface 12R of the substrate 12 as described above with reference to the third to fifth specific examples. This can achieve functions and effects similar to those described above with reference to these specific examples.

Figure 13A:
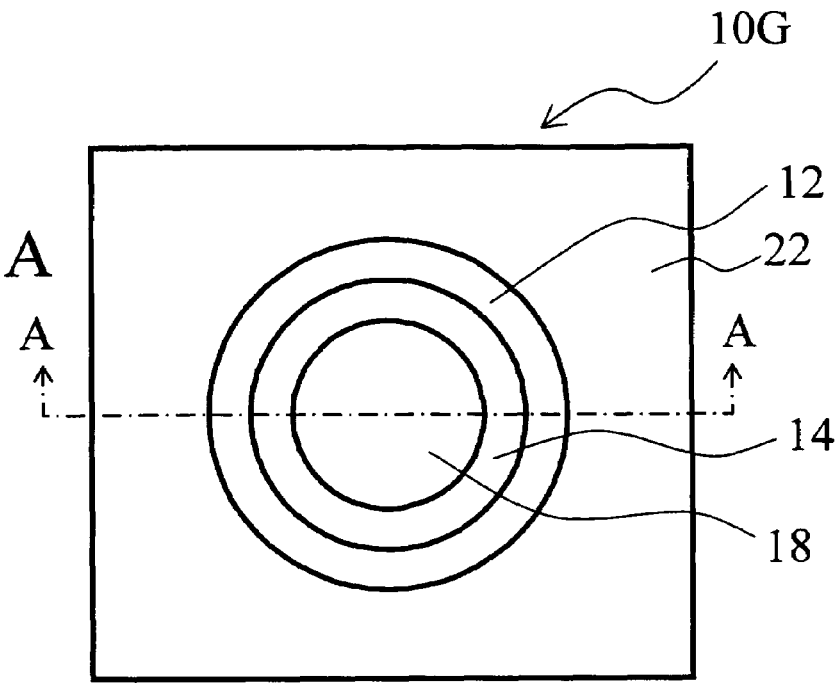
FIG. 13A is a plan view of a seventh specific example of a semiconductor light emitting device of this embodiment as viewed from its electrode.
Figure 13B:
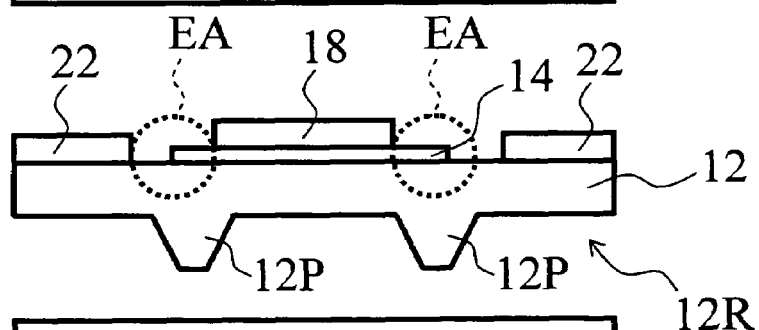
FIG. 13B is a line A—A cross-sectional view of FIG. 13A.
Figure 13C:
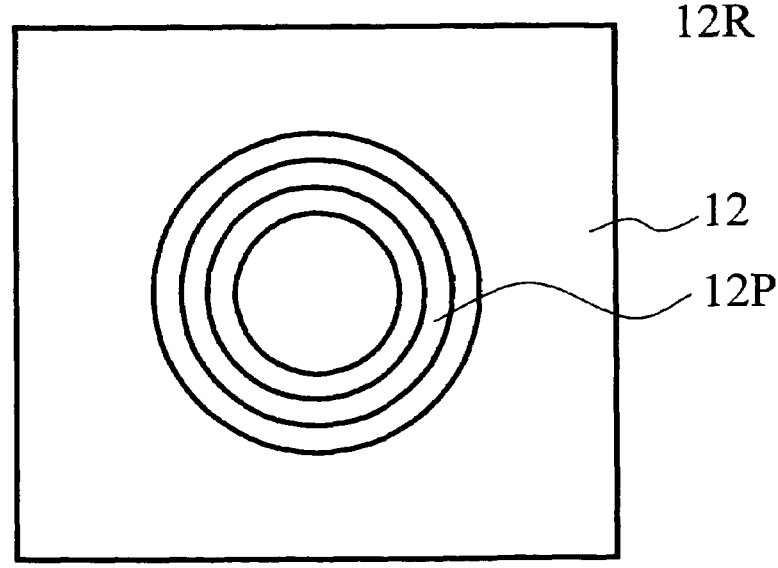
FIG. 13C is a plan view of this semiconductor light emitting device as viewed from its light extraction surface.

FIG. 13 is a schematic view showing a seventh specific example of a semiconductor light emitting device of this embodiment. More specifically, FIG. 13A is a plan view of a semiconductor light emitting device of this specific example as viewed from its electrode, FIG. 13B is a line A—A cross-sectional view of FIG. 13A, and FIG. 13C is a plan view of this semiconductor light emitting device as viewed from its light extraction surface. In FIG. 13, insulating layers and solder electrodes are omitted, and only the arrangement relationship of some of the elements constituting the device is shown.

In this semiconductor light emitting device 10G, a light emitting layer 14 is formed in a substantially circular shape on the substrate 12 having a substantially square shape. On the light emitting layer 14, a substantially circular n-side electrode 18 is formed. A solder electrode and the like (not shown) are provided thereon as appropriate. On the other hand, around the light emitting layer 14, a p-side electrode 22 is formed on the substrate 12. Again, a solder electrode and the like (not shown) are provided thereon as appropriate.

In this specific example, current concentrates at the circumferential edge of the substantially circular light emitting layer 14 to form a light emitting area EA. In agreement with this light emitting area EA, an annular protrusion 12P is provided on the light extraction surface 12R of the substrate 12. With the protrusion 12P like this, extraction efficiency of light emitted from the substantially annular light emitting area EA can be increased.

It should be noted that also in this specific example, the protrusion 12P may be formed by forming grooves 12G in the light extraction surface 12R of the substrate 12 as described above with reference to the third to fifth specific examples. This can achieve functions and effects similar to those described above with reference to these specific examples.

Figure 14A:
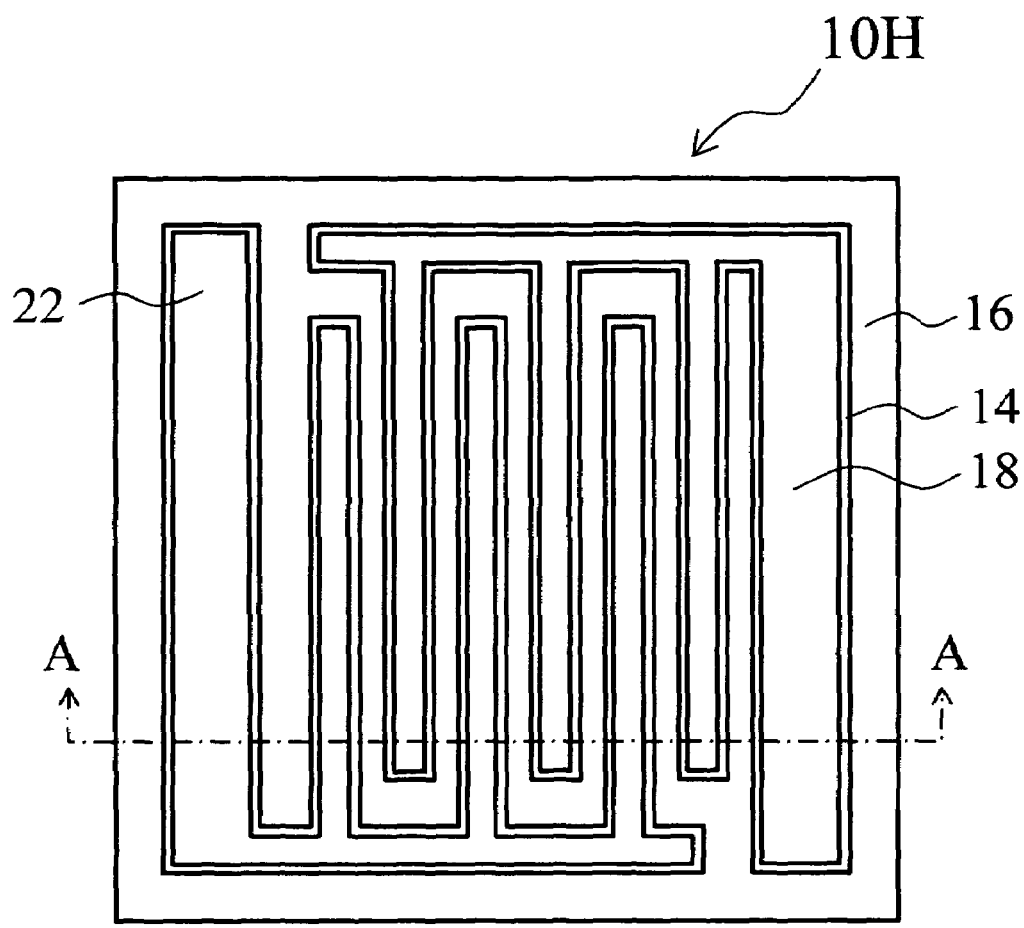
FIG. 14A is a plan view of an eighth specific example of a semiconductor light emitting device of this embodiment as viewed from its electrode.
Figure 14B:
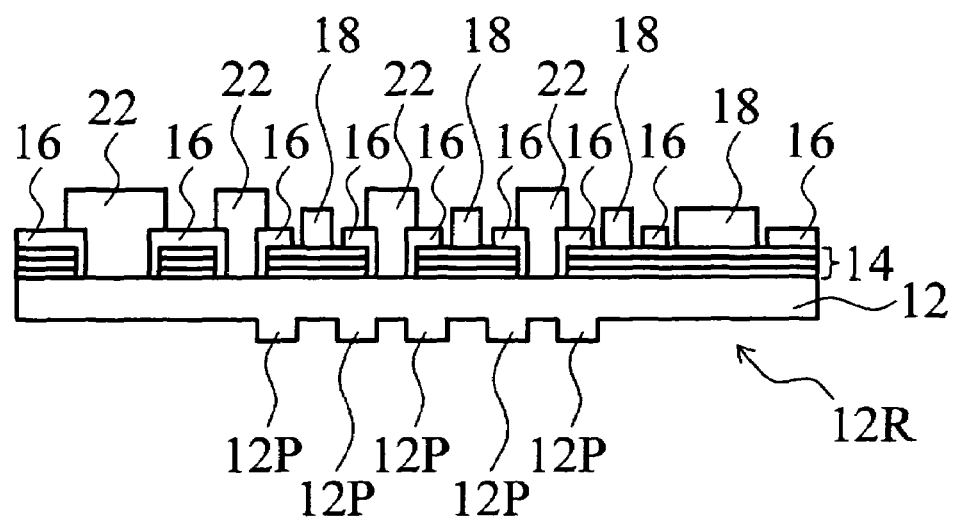
FIG. 14B is a line A—A cross-sectional view thereof.
Figure 15A:
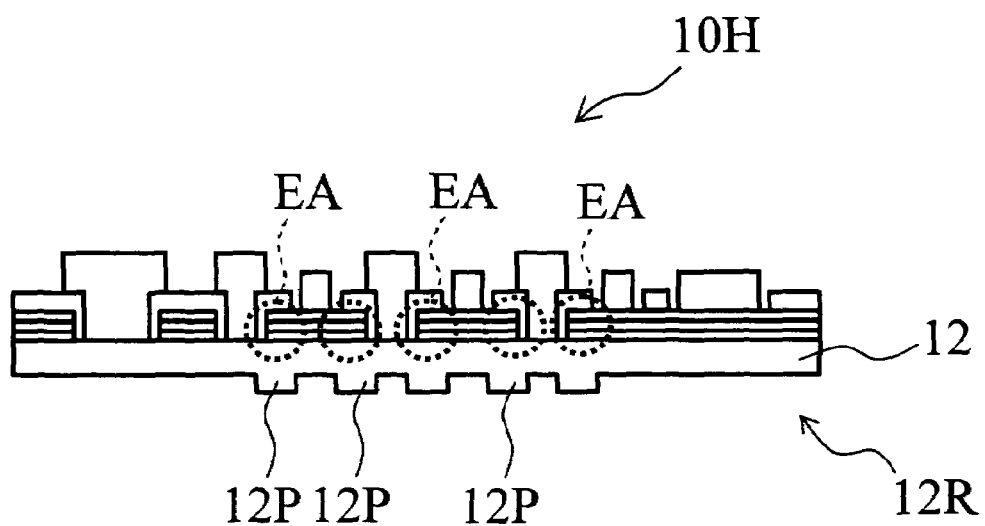
FIG. 15A is a line A—A cross-sectional view of FIG. 14A.
Figure 15B:
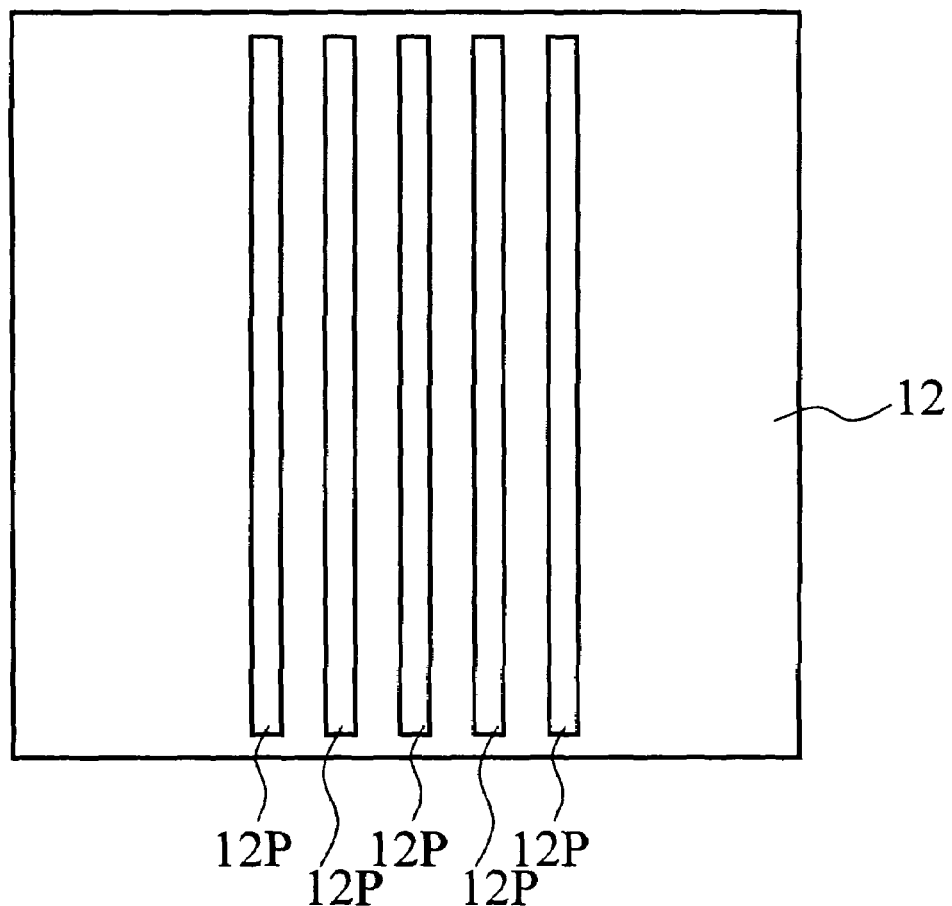
FIG. 15B is a plan view of this semiconductor light emitting device as viewed from its light extraction surface.

FIGS. 14 and 15 are schematic views showing an eighth specific example of a semiconductor light emitting device of this embodiment. More specifically, FIG. 14A is a plan view of a semiconductor light emitting device of this specific example as viewed from its electrode, and FIGS. 14B and 15A are line A—A cross-sectional views thereof. FIG. 15B is a plan view of this semiconductor light emitting device as viewed from its light extraction surface.

This semiconductor light emitting device 10H is provided with a light emitting layer 14 patterned in a comb shape on the substrate 12 having a substantially square shape. An n-side electrode 18 is provided in agreement with the shape of the light emitting layer 14. A p-side electrode 22 is also formed in a comb shape so as to mate with the light emitting layer 14. An insulating layer 16 provides electrical insulation between the light emitting layer 14 and the p-side electrode 22.

In this specific example, current concentrates near the edge of the light emitting layer 14 adjacent to the p-side electrode 22 to form a plurality of linear light emitting areas EA. Patterning the light emitting layer 14 in a comb shape can increase the area (or length) of the light emitting areas, and thereby increasing the brightness.

In agreement with these light emitting areas EA, a plurality of linear protrusions 12P are provided on the light extraction surface 12R of the substrate 12. With the protrusions 12P like this, extraction efficiency of light emitted from the plurality of linear light emitting areas EA can be increased.

It should be noted that also in this specific example, the protrusion 12P may be formed by forming grooves 12G in the light extraction surface 12R of the substrate 12 as described above with reference to the third to fifth specific examples. This can achieve functions and effects similar to those described above with reference to these specific examples.

Figure 16:
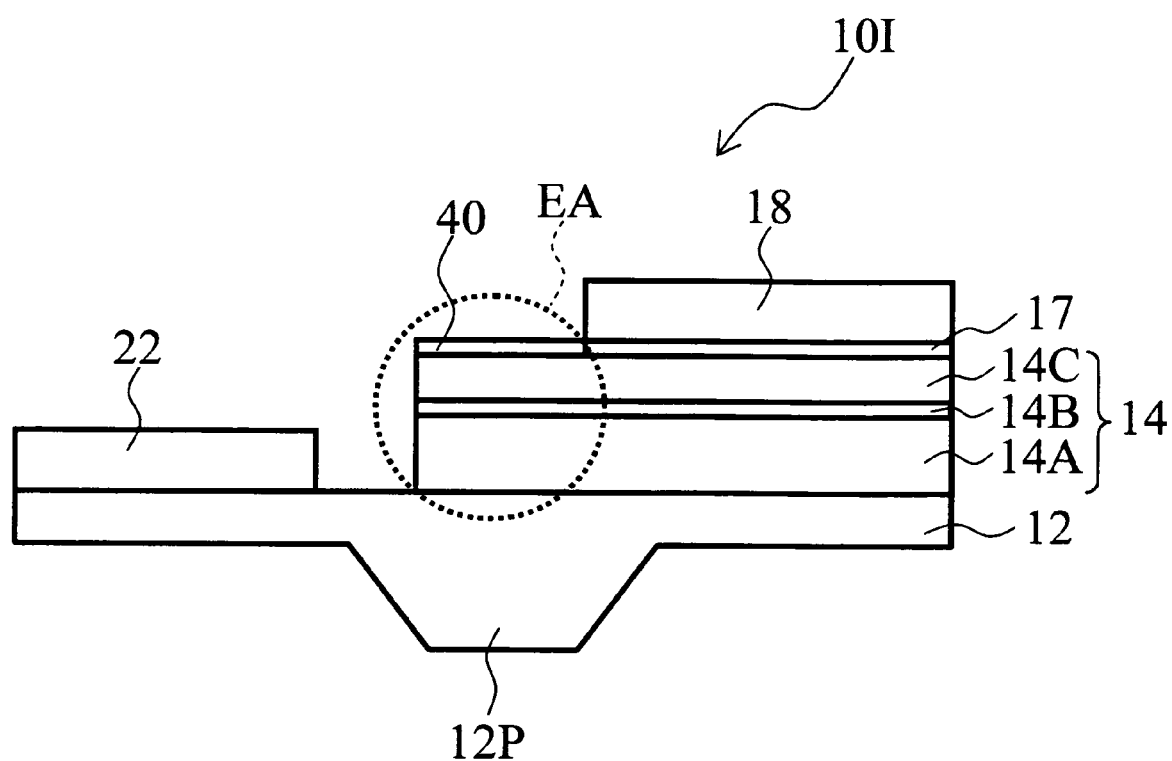
FIGS. 16 and 17 are schematic cross-sectional views showing a ninth specific example of a semiconductor light emitting device of this embodiment.
Figure 17:
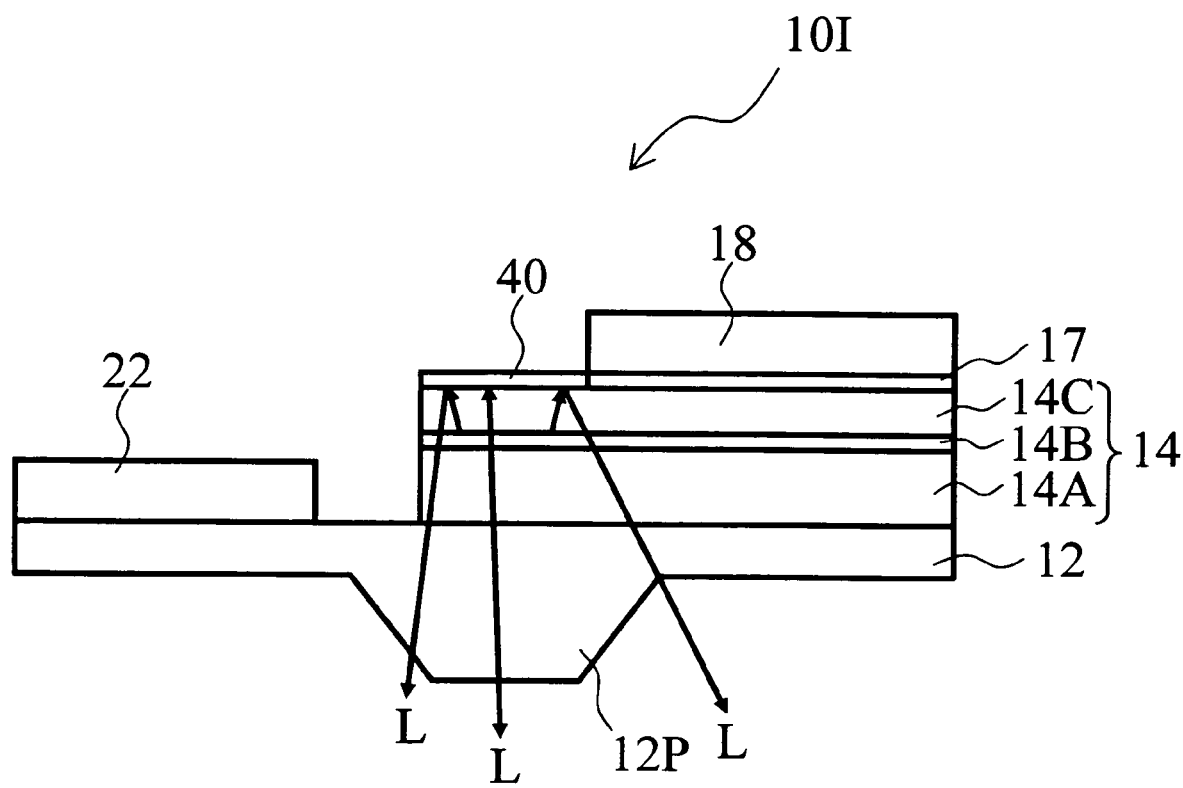

FIGS. 16 and 17 are schematic cross-sectional views showing a ninth specific example of a semiconductor light emitting device of this embodiment.

This semiconductor light emitting device 10I has a light reflecting layer 40 on the light emitting layer 14. The light reflecting layer 40 is adjacent to the n-side electrode 18, and is provided directly above the light emitting area EA.

The light emitting layer 14 comprises a p-type cladding layer 14A, active layer 14B, and n-type cladding layer 14C, on which an n-side electrode 18 is provided via an alloyed area 17. The light reflecting layer 40 is provided in continuation with the alloyed area 17. It should be noted that the light emitting layer 14 may include layers such as a contact layer, optical guide layer, and current diffusion layer (not shown). As described later in detail, the alloyed area 17 is formed by stacking the n-side electrode 18 on metal film constituting the light reflecting layer 40 and alloying them with part of the light emitting layer 14.

Since GaAs has a large barrier height, simply stacked metal will typically form Schottky junction. For this reason, in order to form ohmic junction, the metal must be alloyed with the underlying layer such as GaAs or the like. For electrode metal to form ohmic junction, gold-germanium (AuGe) may be used, as described later in detail.

According to this specific example, with the light reflecting layer 40, as shown in FIG. 17, light emitted from the light emitting layer 14 toward the n-side electrode 18 is reflected toward the substrate 12, which can be externally extracted via the protrusion 12P. As a result, light extraction efficiency can be further increased.

Figure 18:
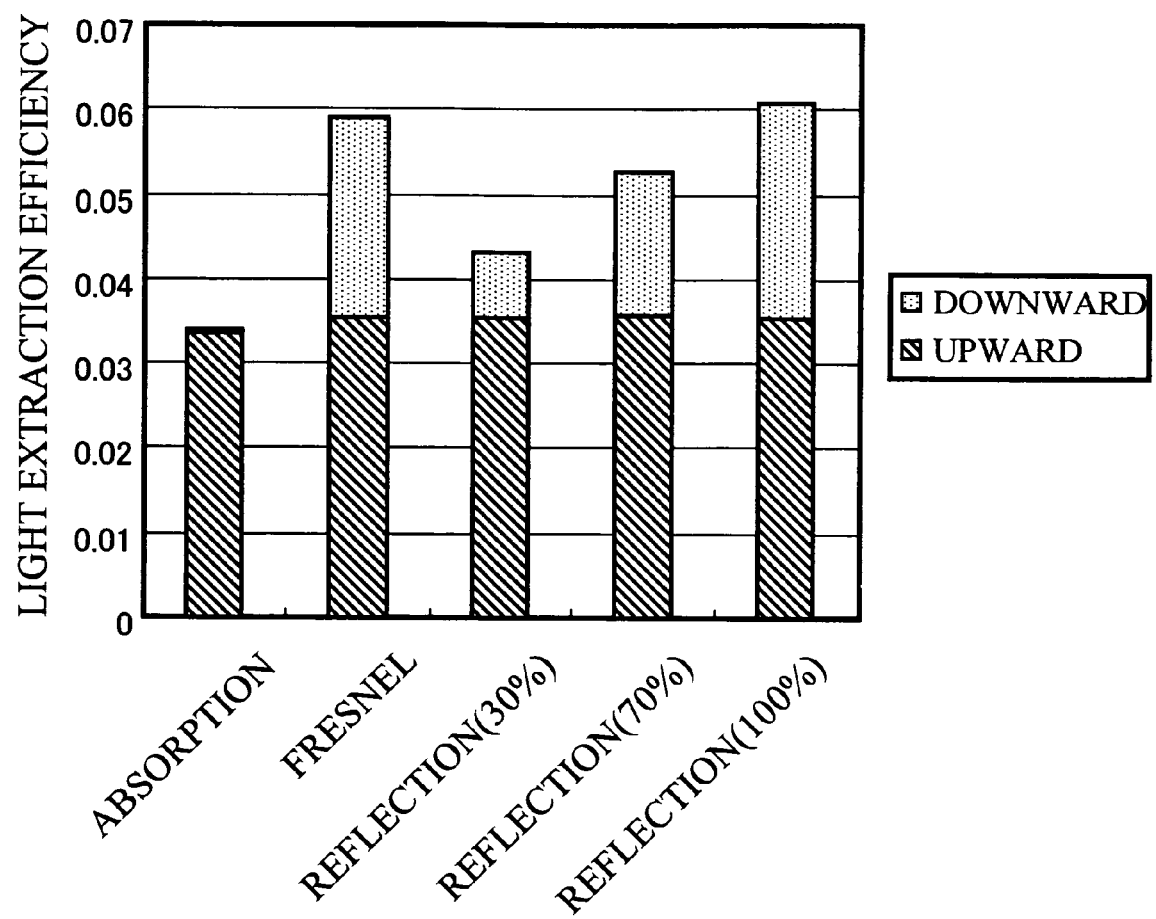
FIG. 18 is a graphical diagram illustrating enhancement of light extraction efficiency due to the light reflecting layer 40.

FIG. 18 is a graphical diagram illustrating enhancement of light extraction efficiency due to the light reflecting layer 40.

More specifically, this figure is a graphical diagram showing extraction efficiency of light emitted "upward", that is, in the direction from the light emitting layer 14 to the substrate 12, and extraction efficiency of light emitted "downward", that is, in the direction from the light emitting layer 14 to the n-side electrode 18, respectively, when the semiconductor light emitting device is flip-chip mounted.

When the light reflecting layer 40 is not provided on the light emitting layer 14 ("absorption"), light emitted "downward", that is, in the direction from the light emitting layer 14 to the n-side electrode 18, is absorbed, which results in a very low extraction efficiency.

In contrast, when a Fresnel reflecting layer is provided on the light emitting layer 14 ("Fresnel"), the "downward" light extraction efficiency is very high.

It is observed from the cases where the light reflecting layer 40 has a reflectance of 30 percent ("reflection (30%)"), 50 percent ("reflection (50%)"), and 100 percent ("reflection (100%)"), respectively, that the "downward" light extraction efficiency increases as the reflectance increases.

As described above, the light extraction efficiency can be significantly increased by providing a light reflecting layer 40 with high reflectance on the light emitting layer 14.

In addition, according to this specific example, high reflectance is obtained using a simple structure by providing the light reflecting layer 40 directly above the light emitting layer 14.

Figure 19:
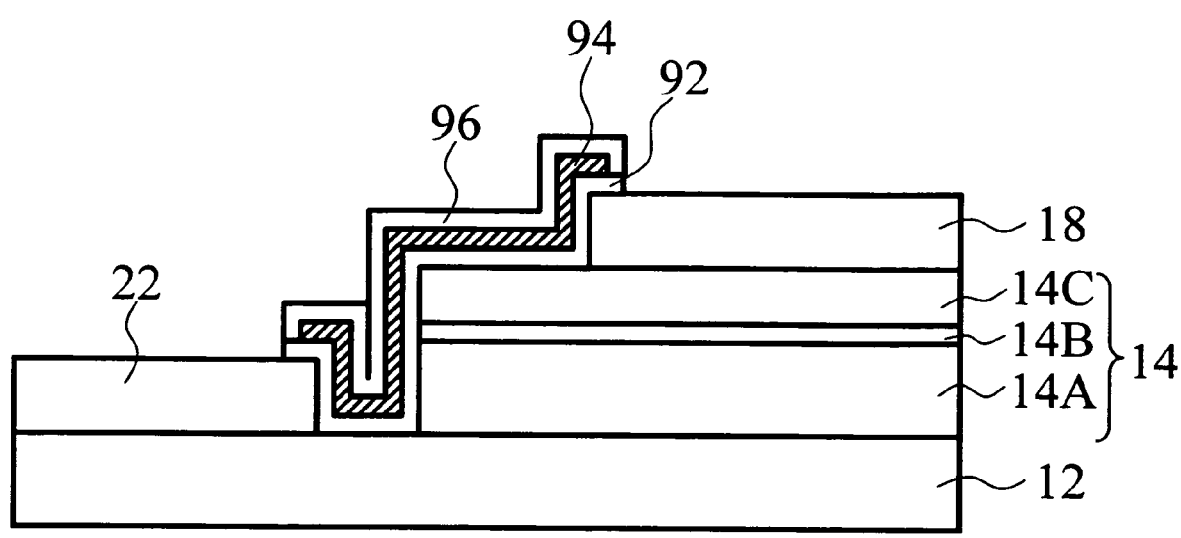
FIG. 19 is a schematic cross-sectional view showing a semiconductor light emitting device of a comparative example investigated in the process leading to the ninth specific example.

FIG. 19 is a schematic cross-sectional view showing a semiconductor light emitting device of a comparative example investigated in the process leading to this specific example.

More specifically, in the device of this comparative example, a light reflecting layer 94 is provided to cover the light emitting layer 14 from its upper surface to its side surface. Since the light reflecting layer 94 is made of metal, forming it directly on the side surface of the light emitting layer 14 will produce a p-n short circuit. In addition, since the light reflecting layer 94 is provided to cover the edge of the n-side electrode 18 and of the p-side electrode 22, respectively, short circuit between these electrodes must be prevented. For this reason, an insulating film 92 is provided below the light reflecting layer 94. In addition, the light reflecting layer 94 is covered with an insulating film 96 from above.

However, in this comparative example, since the insulating film 92 having lower refractive index than the light reflecting layer 94 intervenes between the light emitting layer 14 and the light reflecting layer 94, the reflectance is lower than the case where the light reflecting layer 94 is directly stacked. In addition, there is another problem that extra processes are required for film formation and patterning to form the insulating film 92 and the light reflecting layer 94.

In contrast, according to the ninth specific example of the present embodiment, the light reflecting layer 40 is formed without an intervening insulating film above only the upper surface of the light emitting layer 14, thereby achieving high reflectance. In addition, the manufacturing process can be simplified by self-aligned formation.

In the following, a method of manufacturing a semiconductor light emitting device of this specific example will be described.

FIGS. 20 and 21 are process cross-sectional views showing a relevant part of the process of manufacturing a semiconductor light emitting device of this specific example.

Figure 20A:
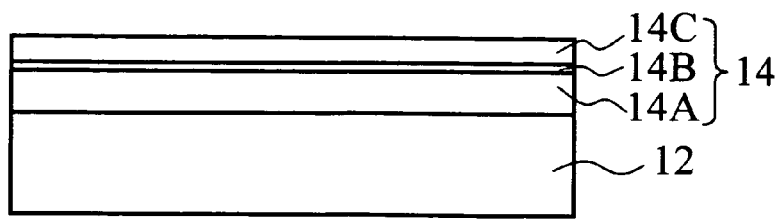
FIGS. 20 and 21 are process cross-sectional views showing a relevant part of the process of manufacturing a semiconductor light emitting device of the ninth specific example.

First, as shown in FIG. 20A, a light emitting layer 14 including a p-type cladding layer 14A, active layer 14B, and n-type cladding layer 14C is formed on a p-type substrate 12. It should be noted that the light emitting layer 14 may include layers such as an optical guide layer, current diffusion layer, and contact layer (not shown) as appropriate.

For example, the light emitting layer 14 may have a structure in which a p-type $Ga_{0.5}Al_{0.5}As$ current diffusion layer, p-type $In_{0.5}Al_{0.5}P$ cladding layer, InGaAlP active layer, n-type $In_{0.5}Al_{0.5}P$ cladding layer, and n-type GaAs contact layer are stacked in this order. In this case, the active layer may have a MQW (multi-quantum well) structure of alternately stacked non-doped $In_{0.5}(Ga_{0.55}Al_{0.45})_{0.5}P$ barrier layers and $In_{0.5}Ga_{0.5}P$ well layers.

The light emitting layer 14 may be epitaxially grown on another substrate (not shown) and then laminated on the substrate 12 by thermocompression bonding. For example, the light emitting layer 14 having the layered structure of the specific example described above can be epitaxially grown on a GaAs substrate. However, the light obtained from this light emitting layer 14 cannot be transmitted through the GaAs substrate. To address this point, the stacked layer structure described above is epitaxially grown on the GaAs substrate in the reverse order, on which a GaP substrate is laminated by thermocompression bonding, and then the GaAs substrate can be removed. In this way, the device can be flip-chip packaged, and light emitted from the light emitting layer 14 can be extracted via the GaP substrate 12.

Figure 20B:
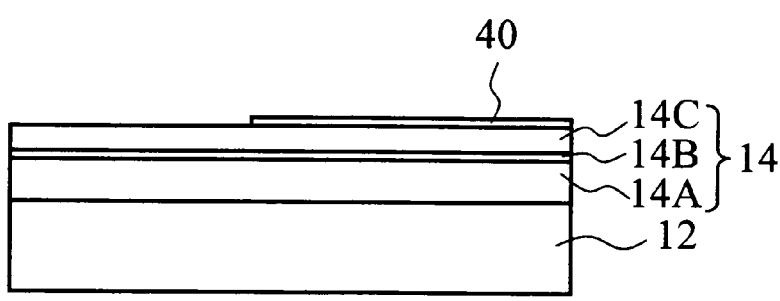

After the stacked body shown in FIG. 20A is formed in this manner, a metal layer to be served as a light reflecting layer 40 is partially formed as shown in FIG. 20B. The light reflecting layer 40 may be made of material such as gold (Au). The light reflecting layer 40 can be formed as shown in FIG. 20B by forming a mask of resist or the like (not shown) on the surface of a wafer, followed by depositing gold, and then removing the mask using liftoff or other methods.

Figure 20C:
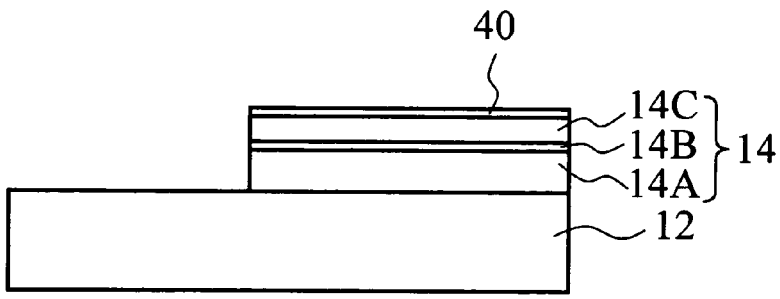

Subsequently, as shown in FIG. 20C, the light reflecting layer 40 is used as a mask to etch the light emitting layer 14. The method of etching may be, for example, RIE (reactive ion etching).

Figure 20D:
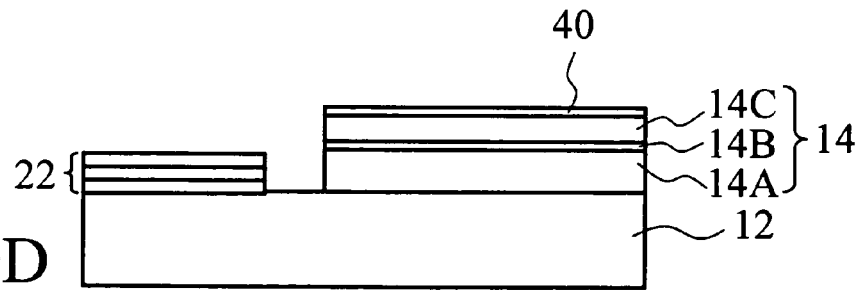

Next, as shown in FIG. 20D, the p-side electrode 22 is formed. More specifically, the p-side electrode 22 can be formed by depositing a metal layer on the p-type substrate 12 exposed by etching the light emitting layer 14, and then sintering it at a predetermined temperature. The p-side electrode 22 may have a structure of Au (50 nm)/AuZn (200 nm)/Au (1 μm) in sequence from the side of the GaP substrate 12, for example (values in parentheses denoting film thickness, the same hereafter). In this structure, ohmic characteristics can be obtained by sintering at 455° C. for about 30 minutes.

Figure 21A:
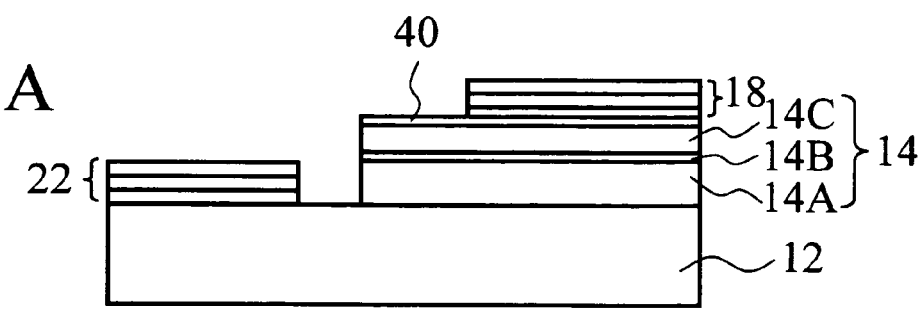

Next, as shown in FIG. 21A, a metal layer 18 to be served as an n-side electrode is formed. More specifically, on the light reflecting layer 40, for example, AuGe (50 nm)/Au (100 nm)/Mo (150 nm)/Au (150 nm)/Mo (50 nm)/Au (600 nm) can be stacked in this order. Here, the Mo layer serves as barrier metal for preventing diffusion and percolation of Ge (germanium) contained in the underlying layer and Ga (gallium) contained in the light emitting layer 14.

Figure 21B:
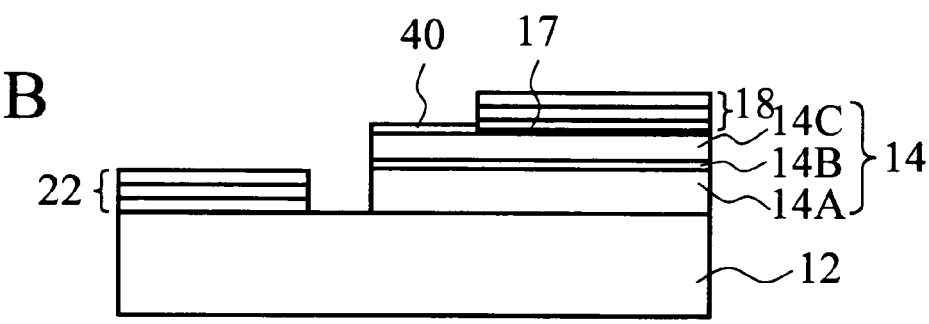

Subsequently, sintering is performed. Then, as shown in FIG. 21B, the light reflecting layer 40, the metal layer 18 to be served as an n-side electrode, and part of the light emitting layer 14 are alloyed to form an alloyed area 17. When the metal layer 18 is formed as the stacked structure of the specific example described above, and sintering is performed, for example, at 405° C. for about 40 minutes, the AuGe layer is diffused through the light reflecting layer 40 into the light emitting layer 14 and alloyed to form an alloyed area 17 mainly composed of germanium (Ge), gold (Au), gallium (Ga), and arsenic (As). This alloyed area 17 yields ohmic characteristics. Specific examples of the n-side electrode and the associated sintering temperature are given below.

TABLE 1

| ELECTRODE STRUCTURE (FROM LOWER LAYER) (UNIT: nm) | SINTER |
|---|---|
| AuGe(Ge3 wt %)(50)/Au(100)// Mo(150)/Au(150)/Mo(50)/Au(600) | 405° C. × 40 min |
| AuGe(50)/Au(100)//Mo(150)/Au(600) | 405° C. × 40 min |
| AuGe(50)/Au(100)//Mo(150)/Au(150)/ Mo(50)/Au(600) | 405° C. × 40 min |
| AuGe(50)/Au(100) | 405° C. × 40 min |
| AuGe(50)/Au(100)//Mo(150)/Au(300)/ Mo(50)/Au(500) | 405° C. × 30 min |

When the sintering temperature for the p-side electrode 22 is lower, the n-side electrode 18 may be first formed and sintered before the p-side electrode 22 is formed and sintered. Besides gold-germanium (AuGe), as electrode metal for forming ohmic junction with GaAs, an electrode having germanium (Ge)/gold (Au)/nickel (Ni) stacked in this order may also be used.

Figure 21C:
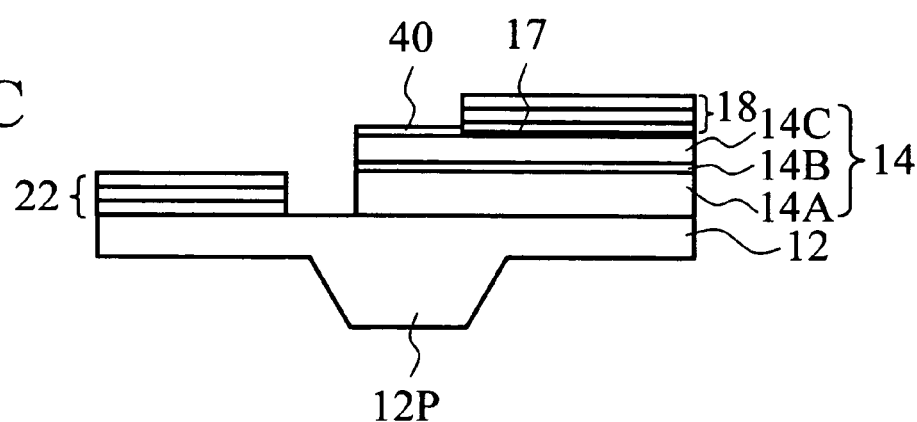

Subsequently, as shown in FIG. 21C, the rear side of the substrate 12 is processed by etching and/or dicing to form a protrusion 12P. Formation of the protrusion 12P may be performed before forming the n-side electrode 18 or p-side electrode 22.

It should be noted that the process of forming an insulating film 16 (not shown) may be provided as appropriate before or after any of the steps described above.

In the manufacturing method of this specific example described above, if the metal layer to be served as a light reflecting layer 40 is too thin, its reflectance for light from the light emitting layer 14 decreases. On the other hand, if the metal layer is too thick, it is not sufficiently alloyed by sintering, making it difficult to obtain ohmic characteristics. When the material of the light reflecting layer 40 is gold (Au), it is desirable that its thickness be 30 nm or more for good reflectance. On the other hand, from the viewpoint of alloying, it is desirable that the light reflecting layer 40 have a thickness of 500 nm or less.

As described above, according to the manufacturing method of this specific example, a stacked layer structure of the light emitting layer 14 and light reflecting layer 40 can be formed in a self-aligned manner by using the metal layer to be served as the light reflecting layer 40 as a mask to pattern the light emitting layer 14. In addition, the n-side ohmic contact can be reliably formed by alloying the light reflecting layer 40, the metal layer to be served as an n-side electrode 18, and part of the light emitting layer 14 to form an alloyed area 17. Furthermore, an alloyed area 17 having lower reflectance for light from the light emitting layer 14 can be formed only directly below the n-side electrode 18 in a self-aligned manner. The light reflecting layer 40 can be provided adjacently to the alloyed area 17. As a result, ohmic characteristics can be reliably obtained, and light extraction efficiency can be increased by forming the light reflecting layer 40 in a self-aligned manner above the light emitting area EA where current concentrates.

Figure 22A:
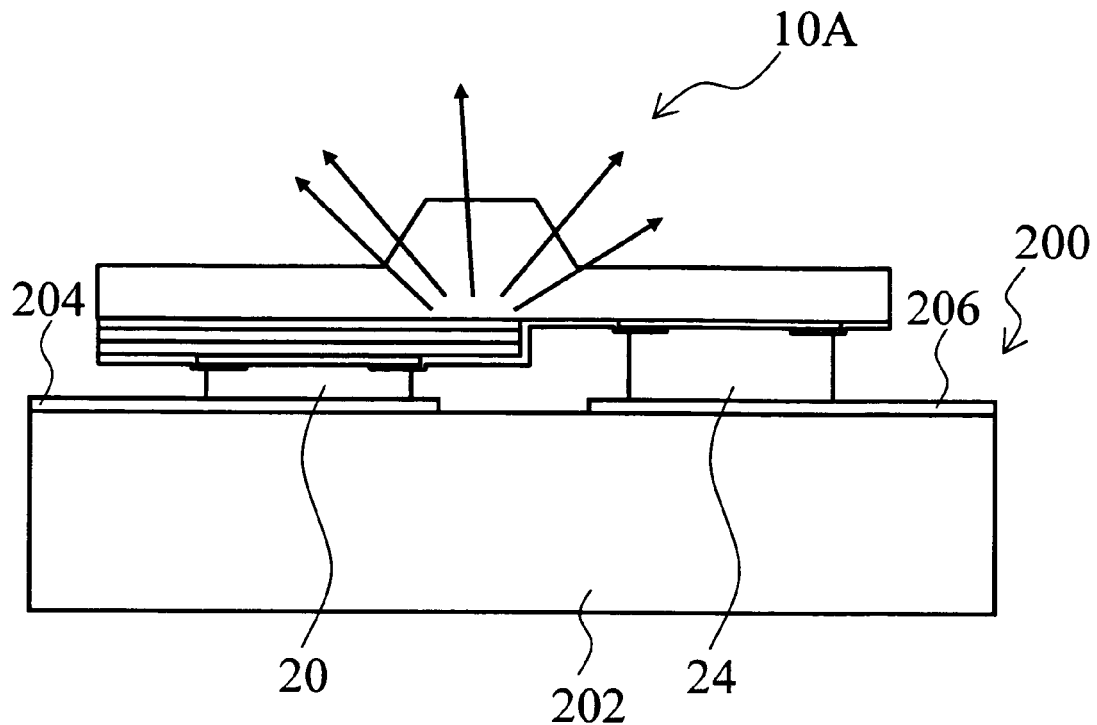
FIG. 22 is a schematic cross-sectional view showing part of a semiconductor light emitting apparatus equipped with a semiconductor light emitting device of this embodiment.
Figure 22B:
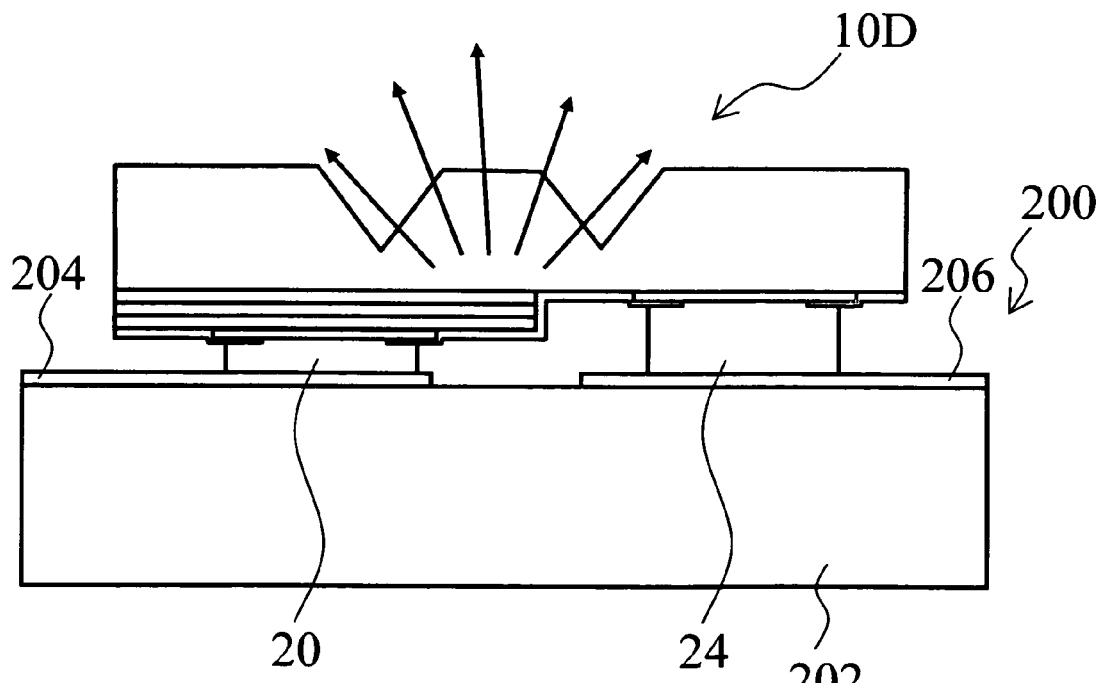

FIG. 22 is a schematic cross-sectional view showing part of a semiconductor light emitting apparatus equipped with a semiconductor light emitting device of this embodiment. More specifically, FIG. 22A shows a semiconductor light emitting apparatus in which the semiconductor light emitting device 10A is flip-chip mounted, and FIG. 22B shows a semiconductor light emitting apparatus in which the semiconductor light emitting device 10D is flip-chip mounted.

The semiconductor light emitting device 10A, 10D is mounted on a packaging substrate 200 with solder electrodes 20 and 24. The packaging substrate 200 comprises an n-side electrode pattern 204 and p-side electrode pattern 206 on a substrate 202. The packaging substrate 200 may be, for example, a chip carrier, or part of a wiring substrate on which an electric circuit is formed around. After the semiconductor light emitting device 10A, 10D is flip-chip mounted, its periphery may be sealed with resin (not shown)

Accordingly, a semiconductor light emitting apparatus with improved light extraction efficiency and increased brightness can be achieved by being equipped with a semiconductor light emitting device of the present embodiment described above with reference to FIGS. 1 to 21.

The embodiments of the invention have been described with reference to specific examples. However, the invention is not limited to these specific examples. For example, any details of the layered structure constituting the semiconductor light emitting device modified as appropriate by those skilled in the art are also encompassed within the scope of the invention, as long as they comprise the feature of the invention. For example, the active layer may be made of various materials in addition to InGaAlP-based material, including $Ga_xIn_{1-x}A_yN_{1-y}$-based ($0 \leq x \leq 1$, $0 \leq y < 1$), AlGaAs-based, and InGaAsP-based materials. Similarly, the cladding layers and optical guide layer may also be made of various materials.

Figure 23:
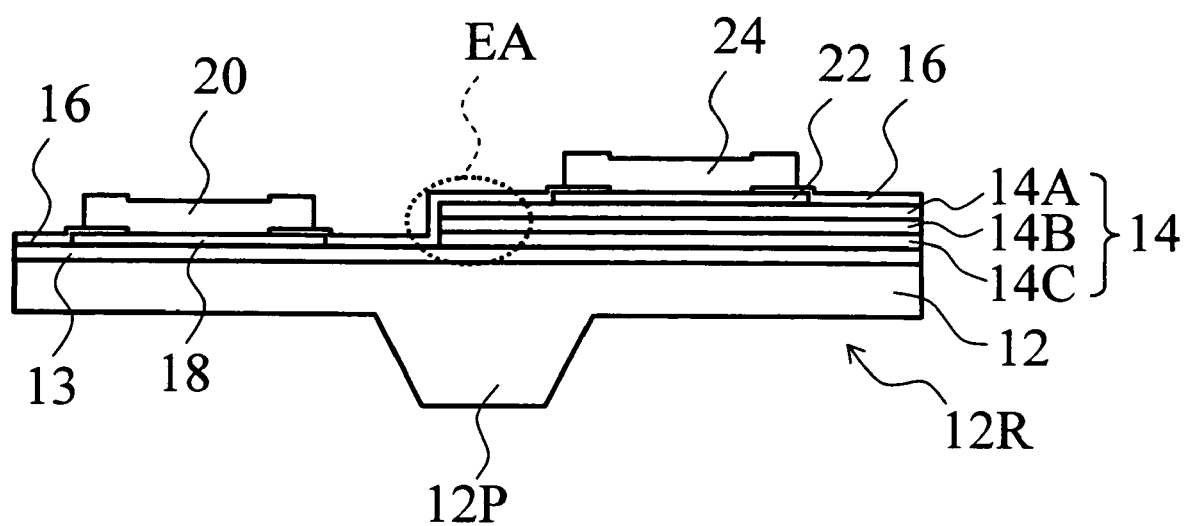
FIG. 23 is a schematic cross-sectional view showing a specific example in which this embodiment is applied to a semiconductor light emitting device including GaInAsN-based material.

FIG. 23 is a schematic cross-sectional view showing a specific example in which this embodiment is applied to a semiconductor light emitting device including GaInAsN-based material.

More specifically, a sapphire substrate 12 is provided as an insulating transparent substrate. An n-type GaN layer 13 is epitaxially grown thereon. On the n-type GaN layer 13, an n-type cladding layer 14C, active layer 14B, and p-type cladding layer 14A are stacked in this order. On the p-type cladding layer 14A, a p-side electrode 22 is formed, on which a solder electrode 24 is formed. On the n-type GaN layer 13, an n-side electrode 18 is formed, on which a solder electrode 20 is formed.

In this specific example, the n-type cladding layer 14C and p-type cladding layer 14A may be made of material such as InGaAlN. The active layer 14B may be made of a single layer of InGaN, or a MQW structure of InGaN and InGaAlN. The light emission wavelength can be selected as appropriate in a wide range from the ultraviolet region to the visible band by selecting appropriate material for the active layer 14B. This light emission can be externally extracted with high efficiency via a protrusion 12P provided on the sapphire substrate 12.

Any shape and size of the semiconductor light emitting device modified as appropriate by those skilled in the art are also encompassed within the scope of the invention, as long as they comprise the feature of the invention. Moreover, the shape, size, arrangement relationship, and number of the protrusion(s) provided on the substrate may also be modified in various ways, any of which is encompassed within the scope of the invention.

On the other hand, also with respect to the semiconductor light emitting apparatus, various apparatuses other than those described above as the specific examples are encompassed within the scope of the invention. They include, for example, a semiconductor light emitting apparatus having a receptacle for coupling an optical fiber in which the semiconductor light emitting device of the invention is incorporated, and a semiconductor light emitting apparatus having a packaging substrate on which the semiconductor light emitting device of the invention is mounted. In effect, any semiconductor light emitting apparatus in which a semiconductor light emitting device of the invention is flip-chip mounted belongs to the scope of the invention.

When grooves 12G are provided on the substrate 12 as described above with reference to FIGS. 5 to 9, the cross-sectional shape of the groove 12G is not limited to the specific example having a substantially V-shaped cross section illustrated in these figures. In addition to them, any semiconductor light emitting device with grooves having various cross-sectional shapes such as grooves having a substantially perpendicular side surface illustrated in FIG. 4 and grooves having a substantially U-shaped cross section in agreement with the protrusion 12P is also encompassed within the scope of the invention.

Any other semiconductor light emitting devices that can be modified and implemented as appropriate by those skilled in the art on the basis of the semiconductor light emitting devices described above as the embodiments of the invention also belong to the scope of the invention.

What is claimed is:

1. A semiconductor light emitting device comprising:
    a substrate having a first major surface and a second major surface;
    a light emitting layer provided in a first portion on the first major surface of the substrate;
    a first electrode provided above the light emitting layer;
    a second electrode provided in a second portion on the first major surface of the substrate, the second portion being different from the first portion; and
    a protrusion provided on the second major surface of the substrate, the protrusion having a planar shape that reflects a planar shape of a light emitting area of the light emitting layer, the light emitting area being sandwiched between the first electrode and the second electrode,
    the protrusion being sandwiched between planar surfaces of the second major surface of the substrate.

2. The semiconductor light emitting device as claimed in claim 1, wherein the protrusion has side surfaces being oblique relative to the second major surface and a tip surface being substantially parallel to the second major surface.

3. The semiconductor light emitting device as claimed in claim 1, wherein the protrusion has side surfaces being substantially vertical to the second major surface and a tip surface being substantially parallel to the second major surface.

4. The semiconductor light emitting device as claimed in claim 1, wherein the protrusion is provided between a pair of grooves formed substantially in parallel on the second major surface of the substrate.

5. The semiconductor light emitting device as claimed in claim 4, wherein a thickness of the substrate at a tip surface of the protrusion and a thickness of the substrate at an outer region of the pair of the grooves are substantially the same.

6. The semiconductor light emitting device as claimed in claim 4, wherein side surfaces of the protrusion are more steeply inclined to the second major surface than side surfaces of the groove opposite to the side surfaces of the protrusion.

7. The semiconductor light emitting device as claimed in claim 4, further comprising light reflecting layers provided on side surfaces of the groove opposite to side surfaces of the protrusion.

8. The semiconductor light emitting device as claimed in claim 1, wherein the protrusion is formed in substantially L-shaped configuration on the second major surface.

9. The semiconductor light emitting device as claimed in claim 1, wherein the protrusion is formed in substantially annular configuration on the second major surface.

10. The semiconductor light emitting device as claimed in claim 1, wherein a plurality of linear protrusions are provided on the second major surface.

11. The semiconductor light emitting device as claimed in claim 1, further comprising a light reflecting layer that is selectively provided above the light emitting area of the light emitting layer.

12. The semiconductor light emitting device as claimed in claim 11, wherein
    the light reflecting layer is made of a first metal, and
    an alloyed area is provided between the first electrode and the light emitting layer, the alloyed area being made by alloying the first metal, the first electrode, and part of the light emitting layer.

13. A semiconductor light emitting device comprising:
    a substrate having a first major surface and a second major surface, the first major surface having a first portion and a second portion;
    a light emitting layer provided in the first portion on the first major surface;
    a first electrode provided above the light emitting layer;
    a second electrode provided in the second portion on the first major surface; and
    a protrusion provided on the second major surface of the substrate, the protrusion corresponding to an edge of the light emitting layer, the edge being sandwiched between the first electrode and the second electrode,
    the protrusion being sandwiched between planar surfaces of the second major surface of the substrate.

14. The semiconductor light emitting device as claimed in claim 13, wherein the protrusion is provided between a pair of grooves formed substantially in parallel on the second major surface of the substrate.

15. The semiconductor light emitting device as claimed in claim 14, wherein side surfaces of the protrusion are more steeply inclined to the second major surface than side surfaces of the groove opposite to the side surfaces of the protrusion.

16. The semiconductor light emitting device as claimed in claim 13, wherein the protrusion is formed in substantially L-shaped configuration on the second major surface.

17. The semiconductor light emitting device as claimed in claim 13, wherein the protrusion is formed in substantially annular configuration on the second major surface.

18. The semiconductor light emitting device as claimed in claim 13, wherein a plurality of linear protrusions are provided on the second major surface.

19. The semiconductor light emitting device as claimed in claim 13, further comprising a light reflecting layer that is selectively provided above the light emitting area of the light emitting layer.

20. A method of manufacturing a semiconductor light emitting device comprising:
    forming a semiconductor multilayered structure on a first major surface of a substrate having the first major surface and a second major surface, the semiconductor multilayered structure including a light emitting layer;
    forming a metal layer selectively on the semiconductor multilayered structure;

removing a part of the semiconductor multilayered structure by using the metal layer as a mask;

forming a second electrode on a region where the part of the semiconductor multilayered structure is removed;

forming a first electrode on the metal layer, the first electrode being apart from an edge of the metal layer, the edge being closer to the second electrode;

alloying a part of the metal layer, the first electrode and an underlying semiconductor layer, the part of the metal layer being under the first electrode; and forming a protrusion by processing the second major surface of the substrate, the protrusion corresponding to an edge of the light emitting layer, the edge being sandwiched between the first electrode and the second electrode, the protrusion being sandwiched between planar surfaces of the second major surface of the substrate.

* * * * *